United States Patent
Doong et al.

(10) Patent No.: US 6,577,149 B2
(45) Date of Patent: Jun. 10, 2003

(54) METHOD AND DEVICE FOR ADDRESSABLE FAILURE SITE TEST STRUCTURE

(75) Inventors: Yih-Yuh Doong, Kaohsiung (TW); Jye-Yen Cheng, Taichung (TW); Ching-Hsiang Hsu Charles, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 09/755,844

(22) Filed: Jan. 5, 2001

(65) Prior Publication Data

US 2002/0089345 A1 Jul. 11, 2002

(51) Int. Cl.$^7$ ............................................. G01R 31/28

(52) U.S. Cl. ....................................................... 324/765

(58) Field of Search .............................. 324/765, 158.1, 324/73.1, 763, 500, 537; 438/14, 18; 257/48

(56) References Cited

U.S. PATENT DOCUMENTS

| | | | |
|---|---|---|---|
| 5,053,700 A | * 10/1991 | Parish | 324/765 |
| 5,070,297 A | * 12/1991 | Kwon et al. | 324/765 |
| 5,504,369 A | * 4/1996 | Dasse et al. | 257/620 |
| 6,292,009 B1 | * 9/2001 | Farnworth et al. | 324/765 |

OTHER PUBLICATIONS

Kelvin Yih–Yuh Doong, et al., "Addressable Failure Site Test Structures (AFS–TS) for CMOS Process: Design Guideline, Fault Simulation, and Implementation," *IEEE trans. on semiconductor manufacturing*, vol. 14, No. 4, pp. 338–355, Nov. 2001.

Kelvin Yih–Yuh Doong, et al., "Defect Detection for Short–loop Process and SRAM–Cell Optimization by Using Addressable Failure Site Test Structures (AFS–TS)", *SPIE's International Symposium on Advanced Microelectronic Manufacturing and Nanotechnologies*, Mar., 2002, Santa Clara, California.

Kelvin Yih–Yuh Doong, et. al., "The Short–Loop Process Tuning & Yield Evaluation by Using the Addressable Failure Site Test Structures (AFS–TS)", *Proc IEEE Int. Symp. Semiconductor Manufacturing (ISSM)*, pp. 165–198, Oct. 2000.

Kelvin Yih–Yuh Doong, et al., "Addressable Failure Site Test Structures (AFS–TS) for Process Development and Optimization", *Proc. IEEE Int. conf. Microelectronic Test Structures*, pp. 51–56, Mar. 2000.

Sunnys Hsieh, et al., "Optimization of Low–k Dielectric (Flourinated SiO$_2$) Process and Evaluation of Yield Impact by Using BEOL Test Structures", *Proc. IEEE Int. conf. Microelectronic Test Structures*, pp. 205–209, Mar. 2000.

(List continued on next page.)

Primary Examiner—Vinh P. Nguyen
(74) Attorney, Agent, or Firm—Blakely Sokoloff Taylor & Zafman, LLP

(57) ABSTRACT

A test structure for detecting defects in a semiconductor wafer and a method for using such test structure are provided. The test structure includes conduction units arranged in an array and test pads connecting to the conduction units. A conduction unit includes closely spaced or intermeshed conduction paths. The test pads are divided into X and Y groups. A pair of test pads X(i), X(i+1) are set to high voltage, a pair of test pads Y(j), Y(j+1) are set to low voltage, and the other test pads are floated. The current I(i, j) flowing from test pad pairs X to Y is measured. If current I(i, j) is a local minimum, then conduction unit (i, j) has a short circuit defect.

6 Claims, 32 Drawing Sheets

OTHER PUBLICATIONS

Kelvin Yih–Yuh Doong, et al., "Novel Assessment of Process Control Monitor in Advanced Semiconductor Manufacturing: A Complete Set of Addressable Failure Site Test Structures (AFS–TS)", *Proc IEEE Int. Symp. Semiconductor Manufacturing (ISSM)*, pp. 241–244, Oct. 1999.

Kelvin Yih–Yuh Doong, et al., "Design and Simulation of Addressable Failure Site Test Structure for IC Process Control Monitor", *Proc. Int. Symp. VLSI Technology, System, and Applications (VLSI–TSA)*, pp. 219–222, Jun. 1999.

* cited by examiner

METHOD AND DEVICE FOR ADDRESSABLE FAILURE SITE TEST STRUCTURE

BACKGROUND OF THE INVENTION

1. Field of the Invention

The present invention relates to semiconductor processing, and more particularly, to a method and device for finding defects in a semiconductor process by using addressable test structure.

2. Background Information

Yield improvement is an important task in semiconductor processing. When a wafer is processed, it typically comprises hundreds of chips, or devices, that are later packaged into individual integrated circuits. After a wafer is manufactured, the wafer is examined to determine the location and types of defects. Either optical inspection of the wafer or electrical testing of the circuits on the wafer may be conducted. The defect patterns are compared with a reference set of defect patterns to identify the failure modes, and then the manufacturing process or equipment associated with those failure modes are adjusted to eliminate the cause of defects and improve yield rate.

In order to determine whether the defects on a wafer match a certain failure mode defect pattern, it is important to know the location of the defects on a wafer. Optical inspection provides an easy method to determine the location of defects caused by particles that have fallen on the wafer. However, not all particles on a wafer cause defects, as when particles fall on non-active regions. Moreover, some defects occur in the buried layers, and cannot be found by optical inspection. Thus, electrical tests are necessary to more thoroughly and accurately determine the existence and location of the defects. The electrical tests may be conducted by simply determining whether the circuitry is functional or defective. By mapping the location of the defective chips on a wafer, the failure modes can be determined and the processing steps may be improved accordingly.

The cause of defects can be more accurately diagnosed if the location of the defects within the chip can be determined. Such information can be used to generate a more detailed wafer defect map. Traditionally, the location of defects within a chip can be determined if the chip is a memory device, such as a RAM chip, a ROM chip, a flash memory chip, etc. Each memory cell within the memory chip has a unique address, and the corresponding location of a cell for each address is predetermined. Thus, the location of defects can be easily determined by testing the functionality of individual cells and mapping the location of the defective cells according to their addresses. However, such a method for determining the location of defects cannot be used for chips other than memory devices, such as logic circuit chips. Unlike memory cells, the logic gates on a logic circuit chip do not have addresses, thus there is no simple method of determining the location of defects by testing the functionality of the logic circuitry.

Therefore, what is needed is a new method of providing an addressable test structure with a small test pad area so that location of defects on a wafer can be easily determined.

BRIEF DESCRIPTION OF DRAWINGS

The present invention will be described in conjunction with the following drawings, wherein.

DETAILED DESCRIPTION OF THE INVENTION

Figure 1A:
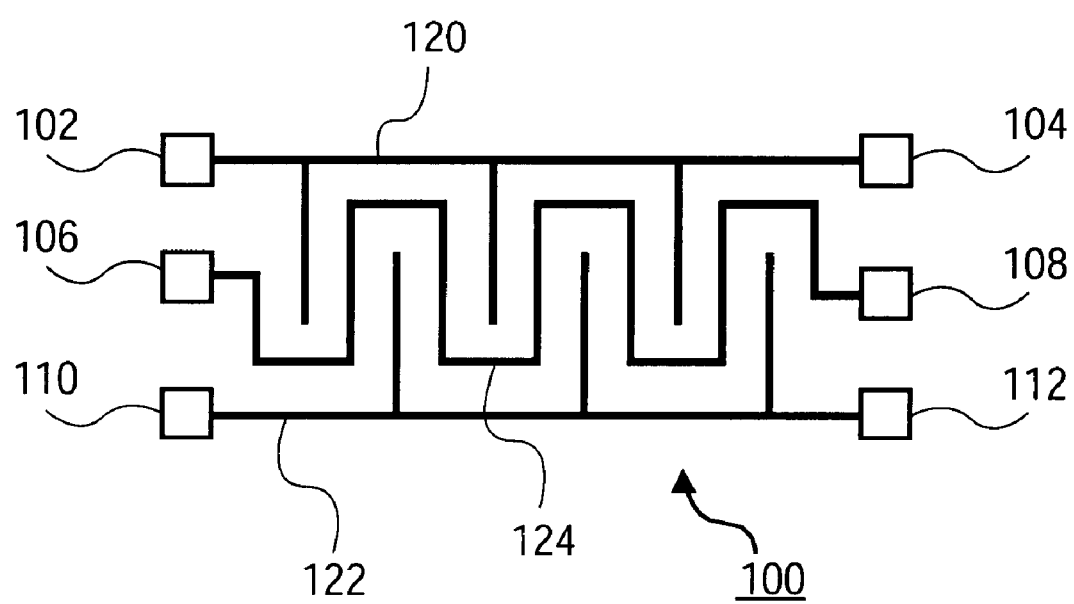
FIG. 1(a) is a test structure comprising a meander-style conduction line.

FIG. 1(a) is a test structure 100 comprising a meander-style conduction line 124, two comb-style conduction lines 120, 122, and test pads 102, 104, 106, 108, 110, 112. The comb line 120 is separated from the meander line 124, and the meander line 124 is separated from the comb line 122. Test structure 100 may be used to determine if any defect occurred within the area covered by the meander line and the comb lines. As an example, a voltage, preferably 1.0 to 3.3 volts, is applied to test pad 102, and a ground voltage is applied to test pad 108. If any current is detected to flow between test pad 102 and test pad 108, then a short circuit defect has occurred between the comb line 120 and the meander line 124. As another example, a high voltage may be applied to test pads 102, and a low voltage applied to test pad 104. If no current flows between test pads 102 and 104, an open circuit defect has occurred on the comb conduction line 120.

Figure 1B:
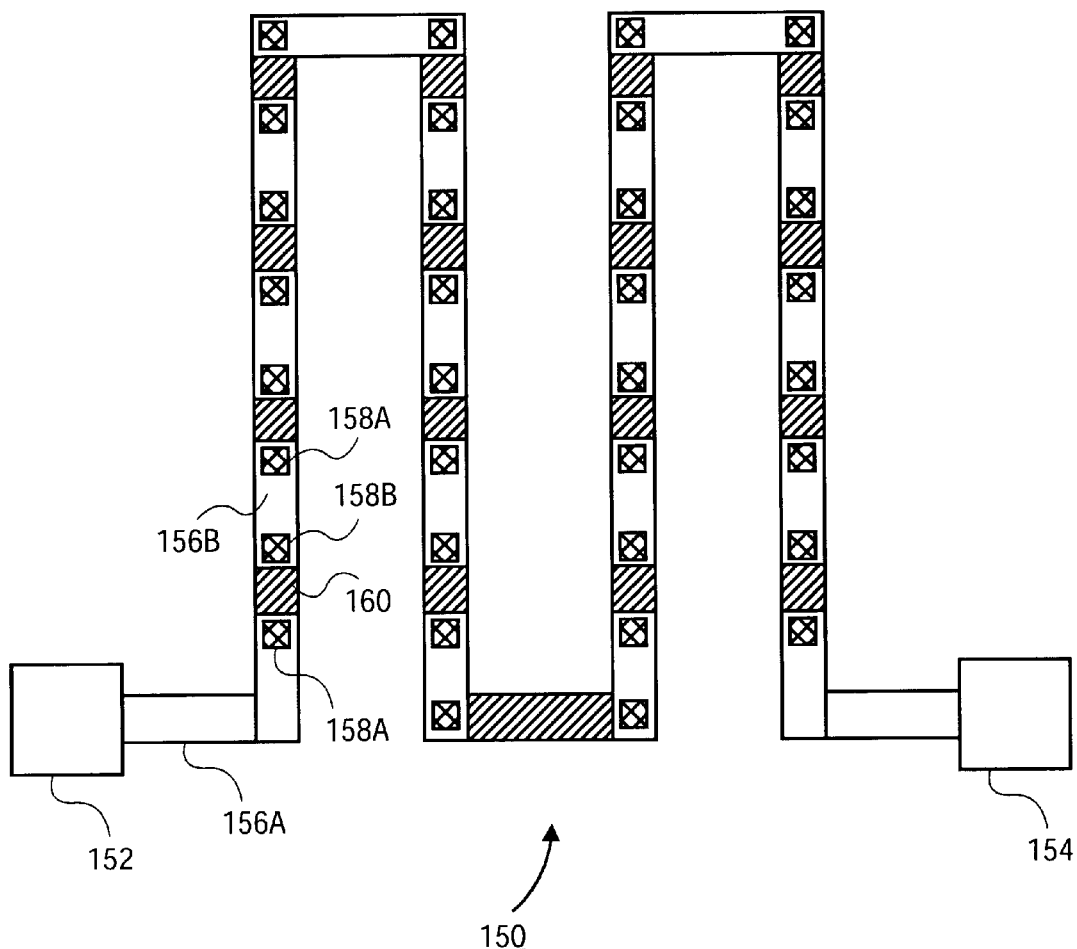
FIG. 1(b) is a test structure comprising test pads and a meander structure with conduction segments and vias.

FIG. 1(b) shows a test structure 150 comprising a meander structure and test pads 152 and 154. The meander structure is a two-layer structure. The upper layer comprises alternating segments of conduction segments 156 and non-conduction segments 160. Contact vias 158a and 158b are situated at both ends of the conduction segment 156. The term contact via hereinafter refers to the combination of a contact and a via. A lower conduction segment (not shown) connects contact vias 158a and 158b. If all of the contact vias that connect the upper conduction segments 156 to the lower conduction segments are functional, then there is an electrical conduction path between test pads 152 and 154. If a high voltage is applied to test pad 152 and a low voltage to test pad 154, and there is no current flowing between tests pads 152 and 154, then either one of the conduction segments is defective, or one of the vias is defective. Thus, the test structure 150 can be used to detect defects that occur in the construction of vias in a chip.

Figures 2A, 2B, 2C:
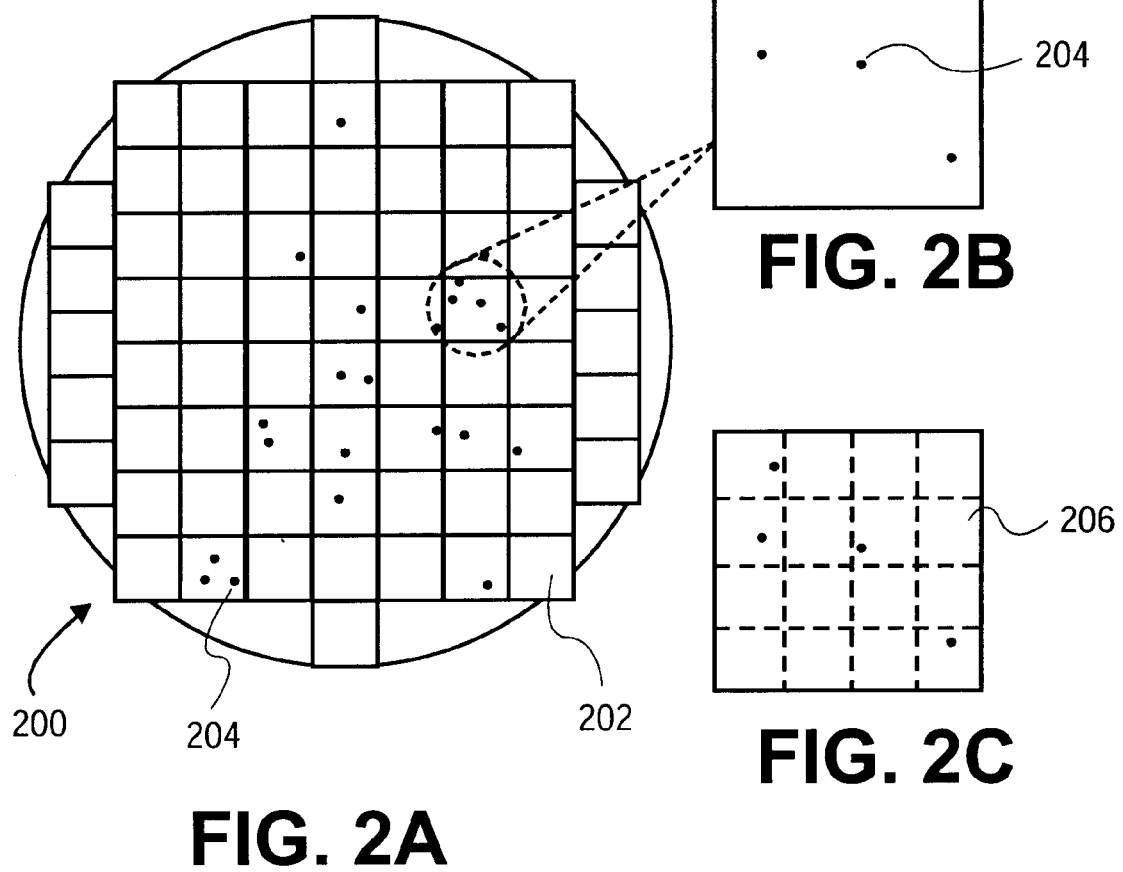
FIG. 2(a) shows a test wafer with test chips.
FIG. 2(b) shows a chip having more than one defects.
FIG. 2(c) shows a chip divided into several sub-regions.

FIG. 2(a) shows a test wafer 200 with several test chips 202. Defects 204 are scattered on the test wafer 200. FIG. 2(b) shows a chip having more than one defect. By dividing the test chip into several sub-regions 206, as shown in FIG. 2(c), only one defect will occur in each sub-region. Thus the location of defects can be more accurately measured.

Figure 3:
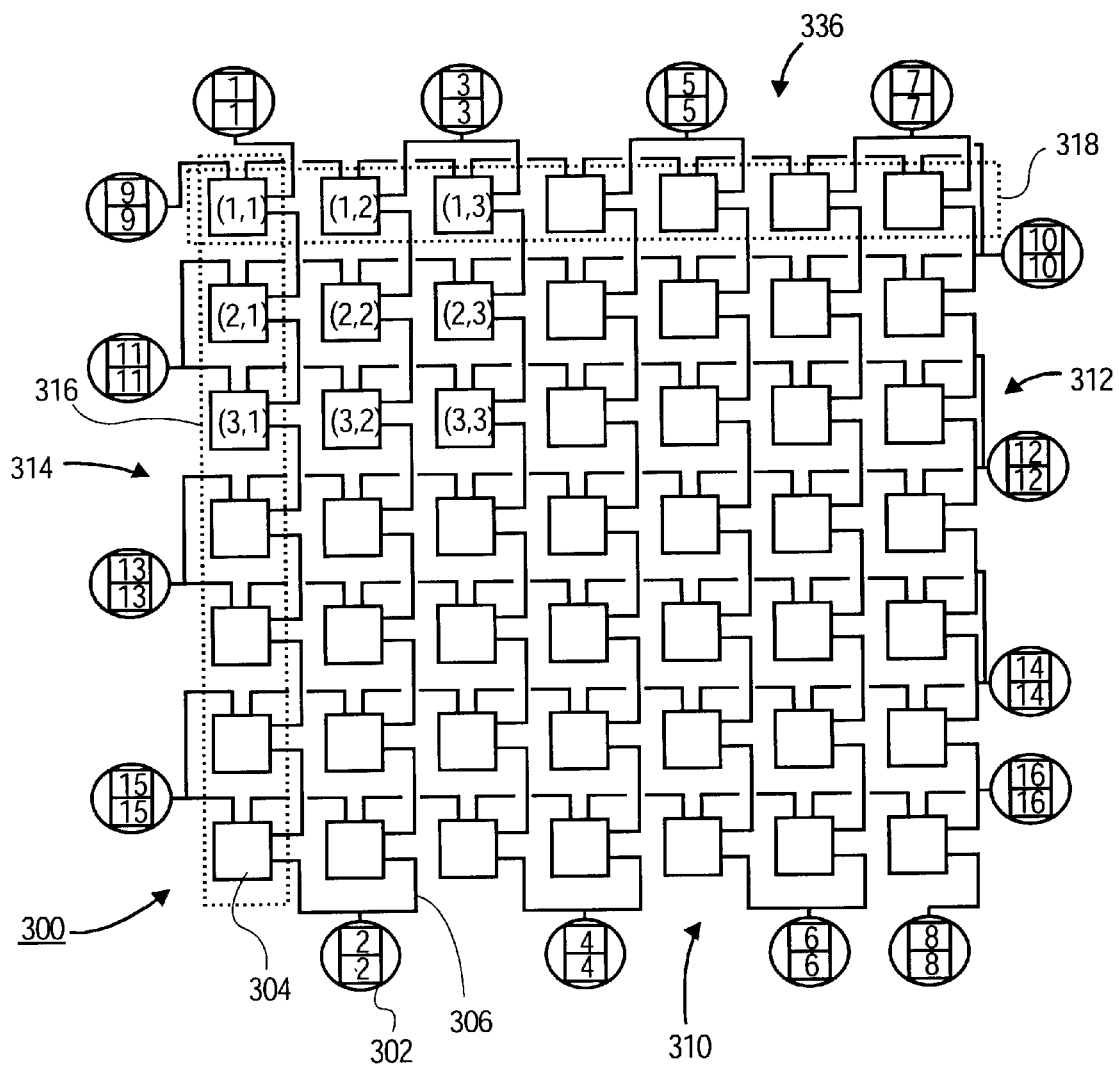
FIG. 3 shows a diagram of a test chip including sixteen test pads and forty-nine conduction units.

FIG. 3 shows a diagram of a test chip 300 including sixteen test pads 302 and forty-nine conduction units 304. The test pads 302 are connected to the conduction units 304 by conduction lines 306. The conduction units 304 are also connected together by conduction lines 306. The structure of conduction unit 304 varies according application, such as whether short circuit defects or open circuit defects are being tested. The conduction unit 304 may also vary according to whether defects in a conduction layer or defects in contact vias are being tested. The conduction units 304 are arranged in an array, with multiple rows 318 and columns 316. For purpose of illustration, the four sides of the array are referred to as the upper side 308, lower side 310, right side 312, and left side 314. The first row (or the uppermost row) of conduction units are labeled (1,1), (1,2), (1,3), and so on. The first column (or the leftmost column) of conduction units are labeled (1,1), (2,1), (3,1), and so on.

Figure 4A:
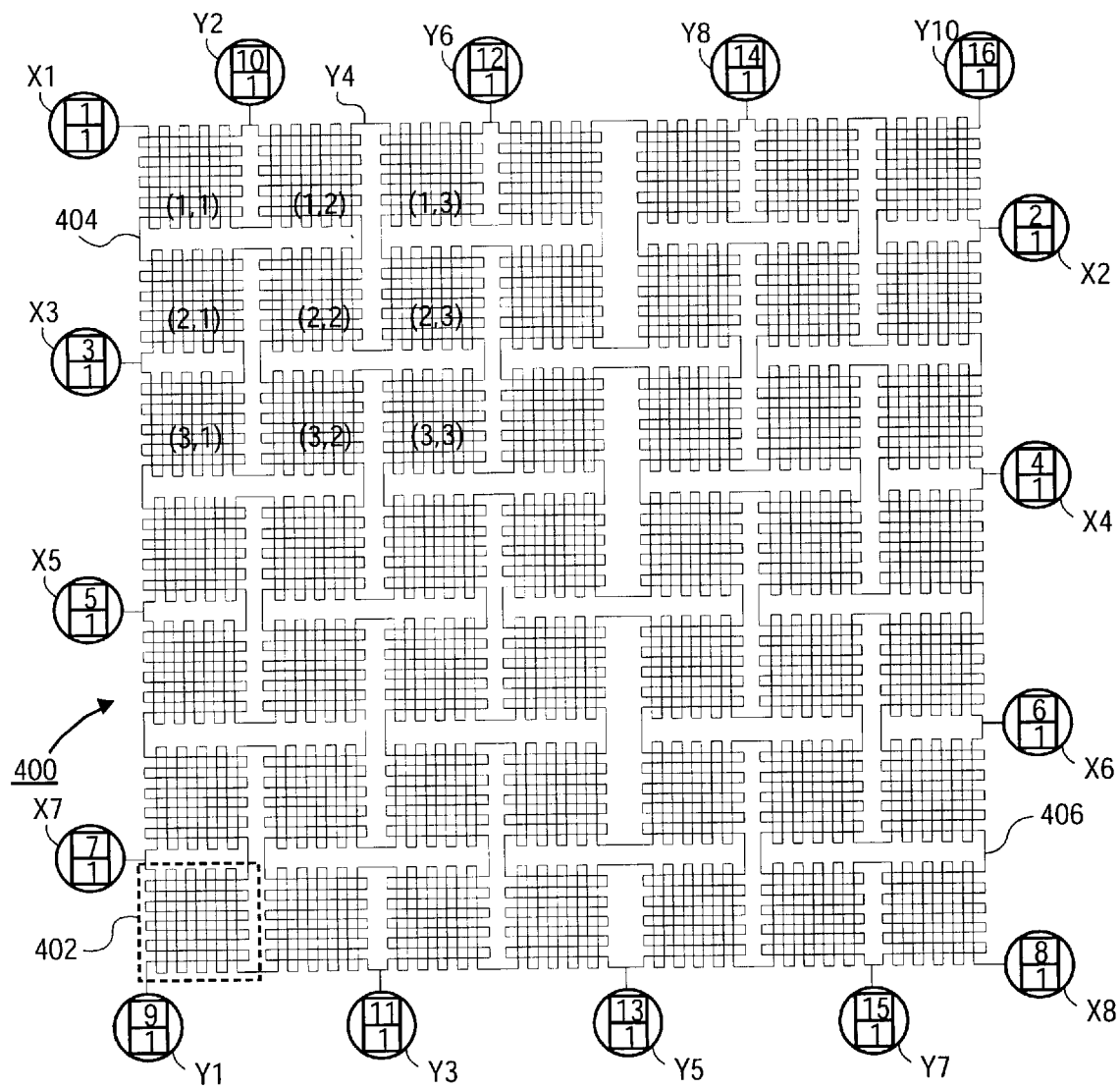
FIG. 4(a) shows a test chip including forty-nine conduction units and sixteen test pads.

FIG. 4(a) shows a test chip 400 including forty-nine conduction units 402 and sixteen test pads. Each conduction unit 402 is composed of an array of intermeshed conduction paths, the details of which are shown in FIG. 4(c). Test chip 400 includes two sets of test pads. The first set of test pads include test pads X1, X2, X3, X4, X5, X6, X7, and X8; they are electrically connected together by conduction path 404. The second set of test pads include test pads Y1, Y2, Y3, Y4, Y5, Y6, Y7, and Y8; they are connected together by conduction path 406.

By measuring the conductivity between the test pads Y1 and Y2, any open circuit defect located within the first column of conduction units can be detected. By measuring the conductivity between the test pads X1 and X2, any open circuit defect located within the first row of conduction units can be detected. If the connectivity between test pads X1 and X2 is broken, and the connectivity between test pads Y1 and Y2 is also broken, while the conduction paths in all other rows and columns are intact, then it may be inferred that there is a defect in the conduction unit (1,1). The location of defects in any of the 49 conduction units can be determined in a likewise manner.

To determine whether there is a short-circuit defect, first, the test pads X1, X2 are set to voltage, preferably 1 to 3.3 volts. The test pads Y1, Y2 are set to ground voltage. The other test pads are floated. If there is no current flowing between test pads X1, X2 to Y1, Y2 then there is no short-circuit defect. If there is a current, then the magnitude of the current is measured, and denoted as I(1,1). Next, test pads X1, X2 are still set high, while test pads Y2, Y3 are set to ground, and the others floated. The current flowing from test pads X1, X2 to Y2, Y3 is measured as I(1,2). This process is repeated, with I(1,7) measured by setting test pads X1, X2 to high, test pads Y6, Y7 to ground, and others floating. Next, test pads X2, X3 are set to high, test pads Y1, Y2 are set to ground, and others floating. The current flowing from test pads X2, X3 to Y1, Y2 is measured as I(2,1). The process is repeated until I(i, j) (i=1 . . . 7, j=1 . . . 7) are all measured. The location of a short-circuit defect is determined by finding the "local maximum" of currents. As an example, if there is a short-circuit defect in conduction unit (2,2), then current I(2,2) will be larger than current I(1,1), I(1, 2), I(1,3), I(2,1), I(2,3), I(3,1), I(3,2), and I(3,3). Current I(2, 2) will be flowing from test pads X2, X3 to Y2, Y3 via conduction unit (2,2). The conduction path between X3 and Y2 is the shortest of all conduction paths between X test pads and Y test pads, has the least resistance, and thus has the largest leakage current.

Figure 4B:
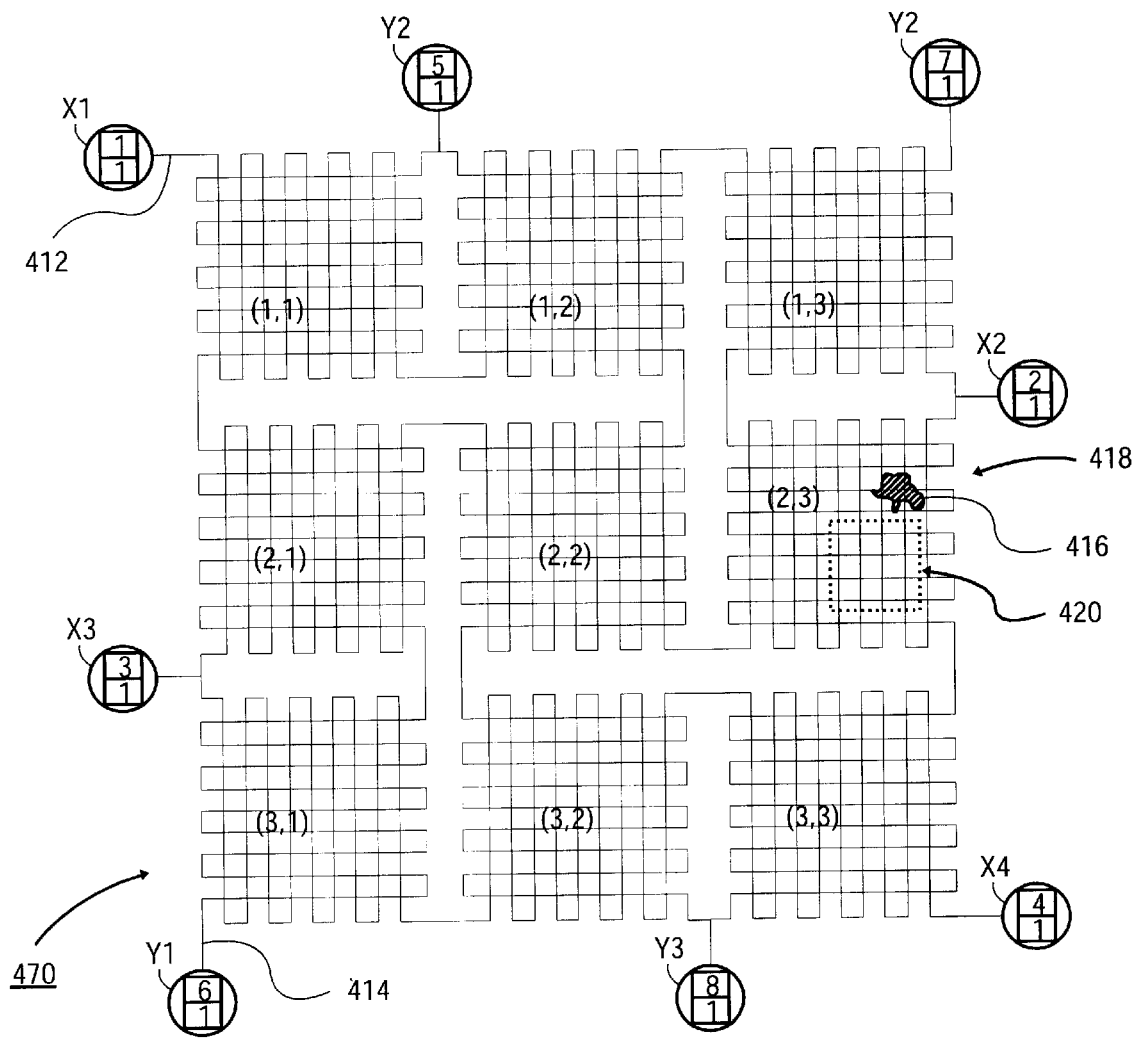
FIG. 4(b) shows a test chip with nine conduction units.
Figure 4C:
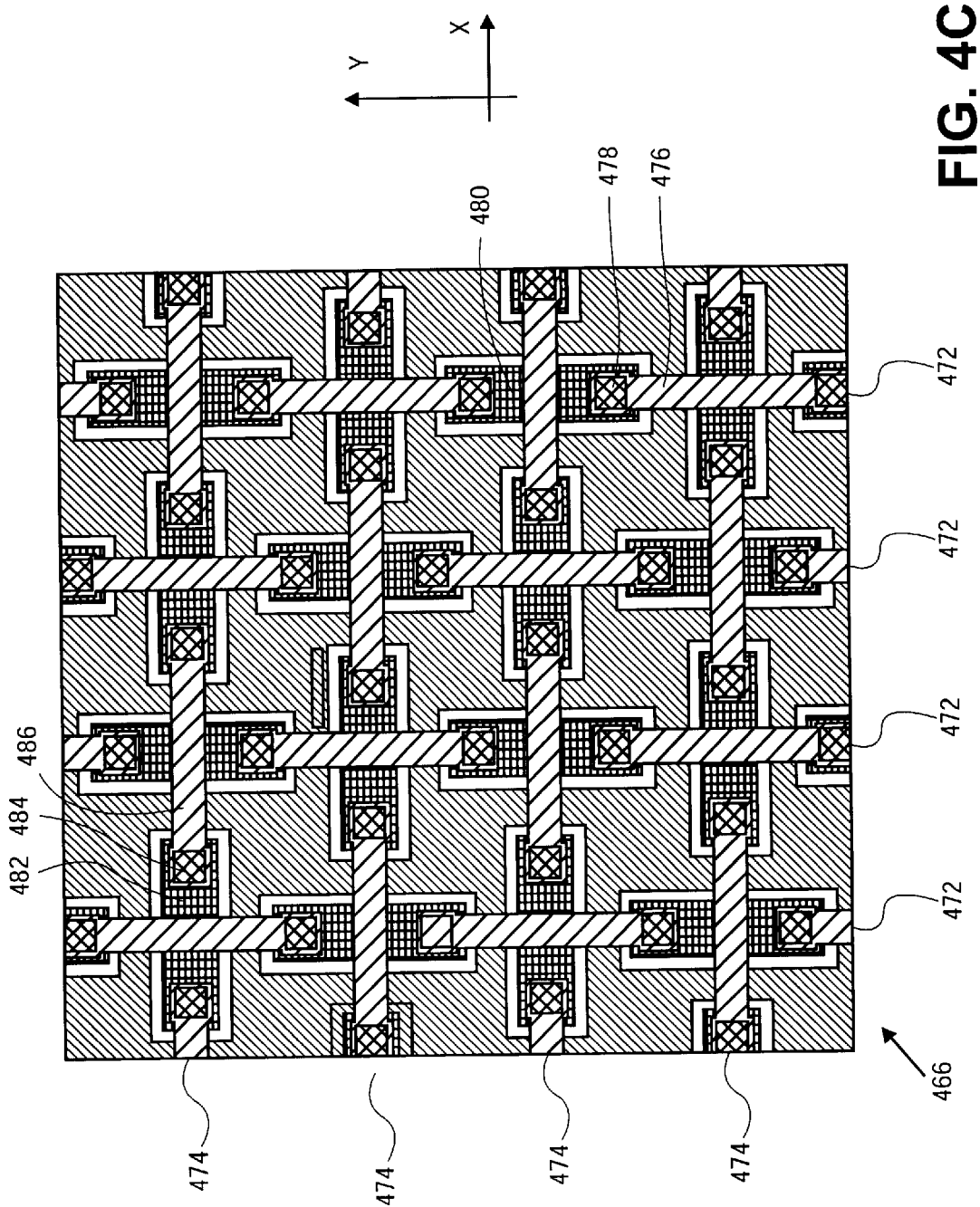
FIG. 4(c) shows a portion of a test chip with four conduction paths running in the Y-direction, and four conduction paths running in the X-direction.

FIG. 4(b) shows a test chip 410 with nine conduction units 418. Test chip 410 comprises two sets of test pads. The test pads X1, X2, X3, and X4 are connected together by conduction path 412. Conduction path 412 runs from test pad X1 to X4 through the nine conduction units in the sequence of (1,1), (1, 2), (1, 3), (2, 3), (2, 2), (2, 1), (3, 1), (3, 2), (3, 3). The test pads Y1, Y2, Y3, and Y4 are connected together by conduction path 414. Conduction path 414 runs from test pad Y1 to Y4 through the nine conduction units in the sequence of (3,1), (2, 1), (1, 1), (1, 2), (2,2), (3, 2), (3, 3), (2, 3), (1, 3). If a particle 416 falls in conduction unit 418, such that the conduction paths are broken, then the test pads Y3 and Y4 will be open circuited, and test pads X2 and X3 will also be open circuited. The conduction unit 418 may comprise several types of conduction line and via interconnect patterns. An enlargement of a portion 420 of the conduction unit 418 is shown in FIG. 4(c).

FIG. 4(c) shows four conduction paths 472 running in the Y-direction, and four conduction paths 474 running in the X-direction. The conduction path 472 comprises of alternating segments of upper conduction segment 476 and lower conduction segment 480. The upper conduction segment 476 and the lower conduction segment 480 are connected by the contact via 478. The conduction path 474 comprises of alternating segments of upper conduction segment 486 and lower conduction segment 482. The upper conduction segment 486 and the lower conduction segment 482 are connected by the contact via 484.

Figure 5B:
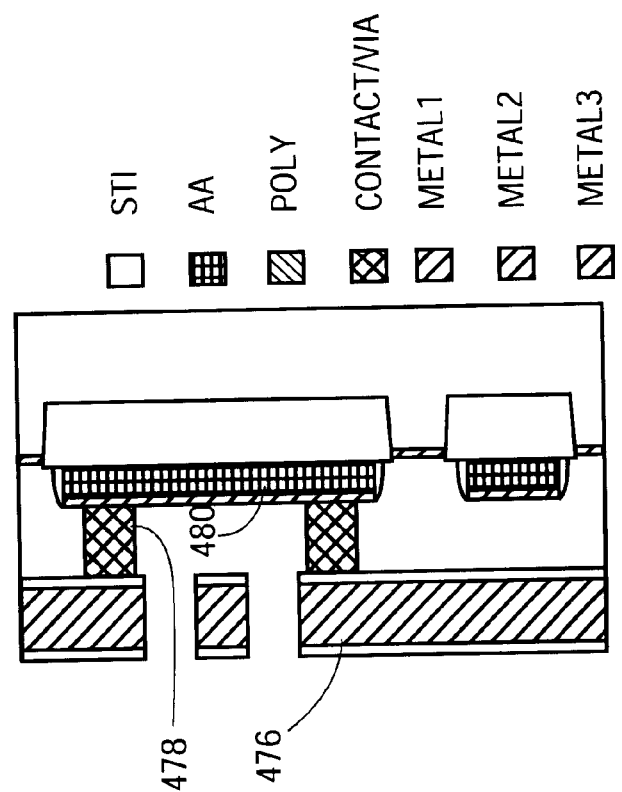
FIG. 5(b) is a cross sectional view of the upper/lower conduction segments and contact via.
Figure 5A:
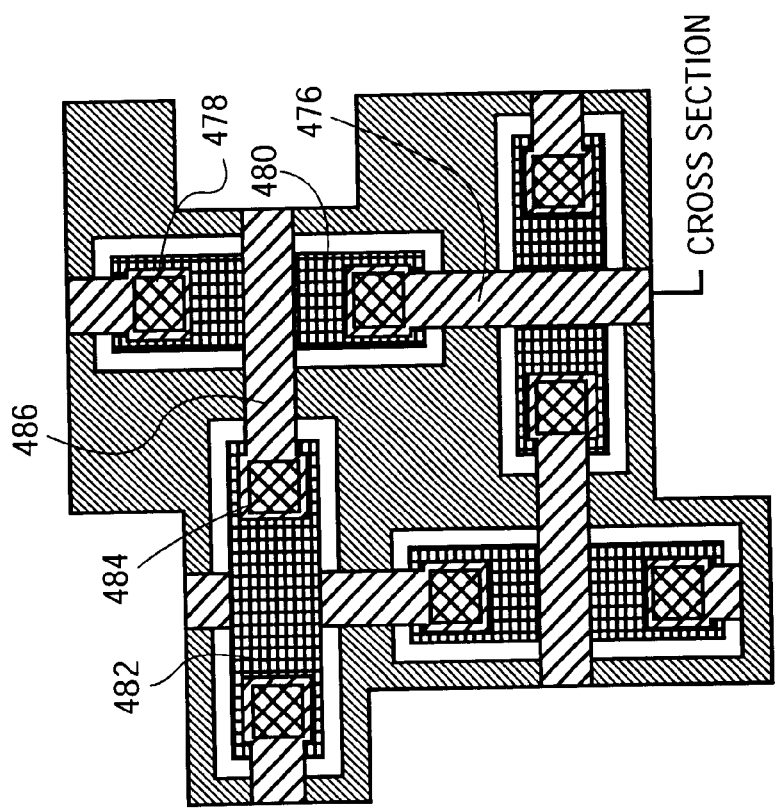
FIG. 5(a) shows a detailed diagram of the upper conduction segment, lower conduction segment, and the contact via for a test chip.

FIG. 5(a) shows a detailed diagram of the upper conduction segment 476, lower conduction segment 480, and the contact via 478. FIG. 5(b) is a cross sectional view of the upper/lower conduction segments and contact via. Preferably, the upper conduction segment 476 is produced using a metal layer; the lower conduction segment 480 is produced using a polysilicon layer. The contact via is composed of tungsten. Such a test structure is useful in detecting defects that occur in the contact via and the upper/lower conduction segments.

Figure 6A:
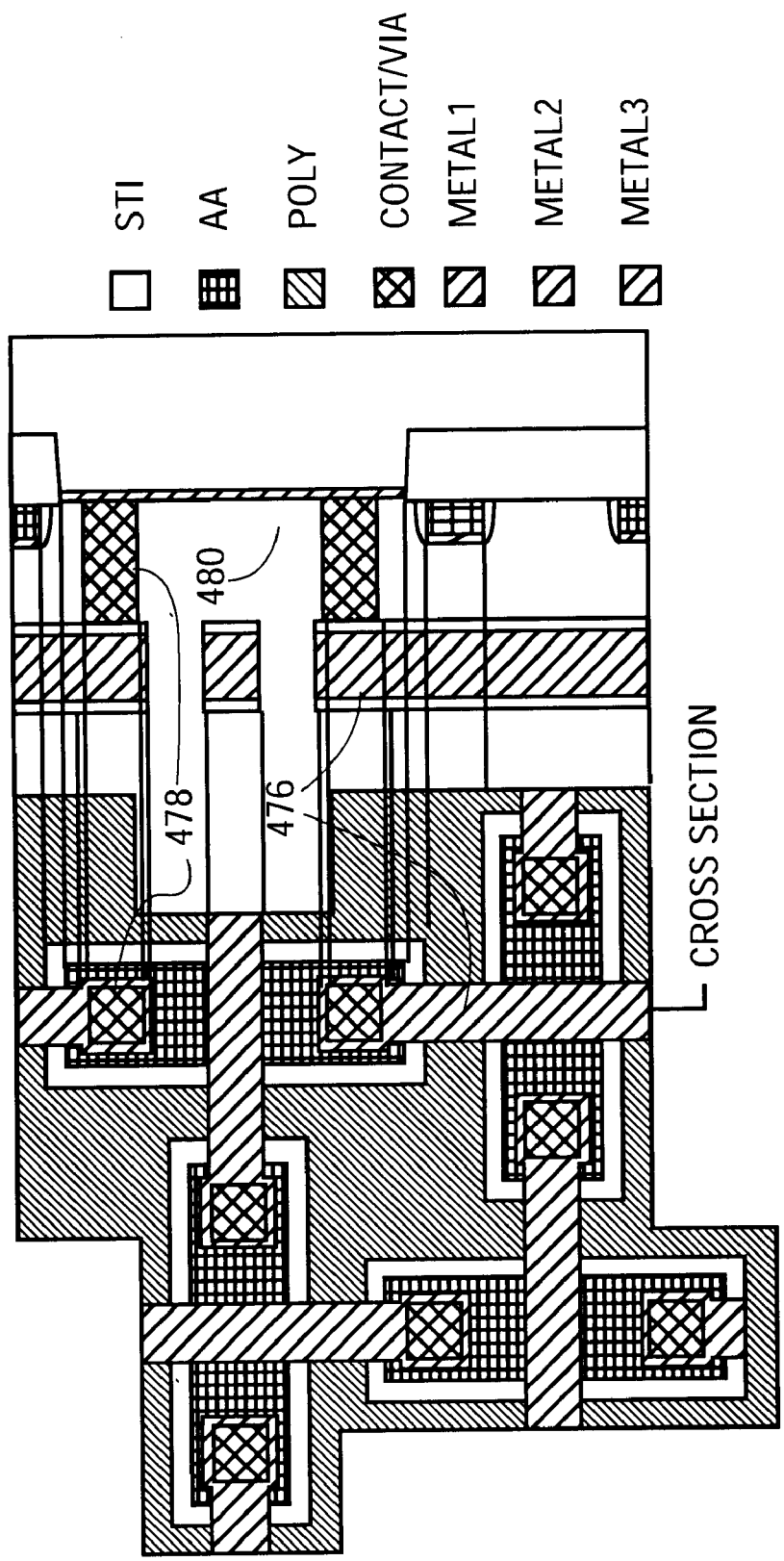
FIG. 6(a) shows a test structure that can be used to detect defects in the contact via of a wafer.

FIG. 6(a) shows an alternative test structure that can be used to detect defects in the contact via of a wafer. The upper conduction segment 476 is composed of a first metal layer, the lower conduction segment 480 is composed of a second metal layer, and the contact via is composed of tungsten.

Figure 6B:
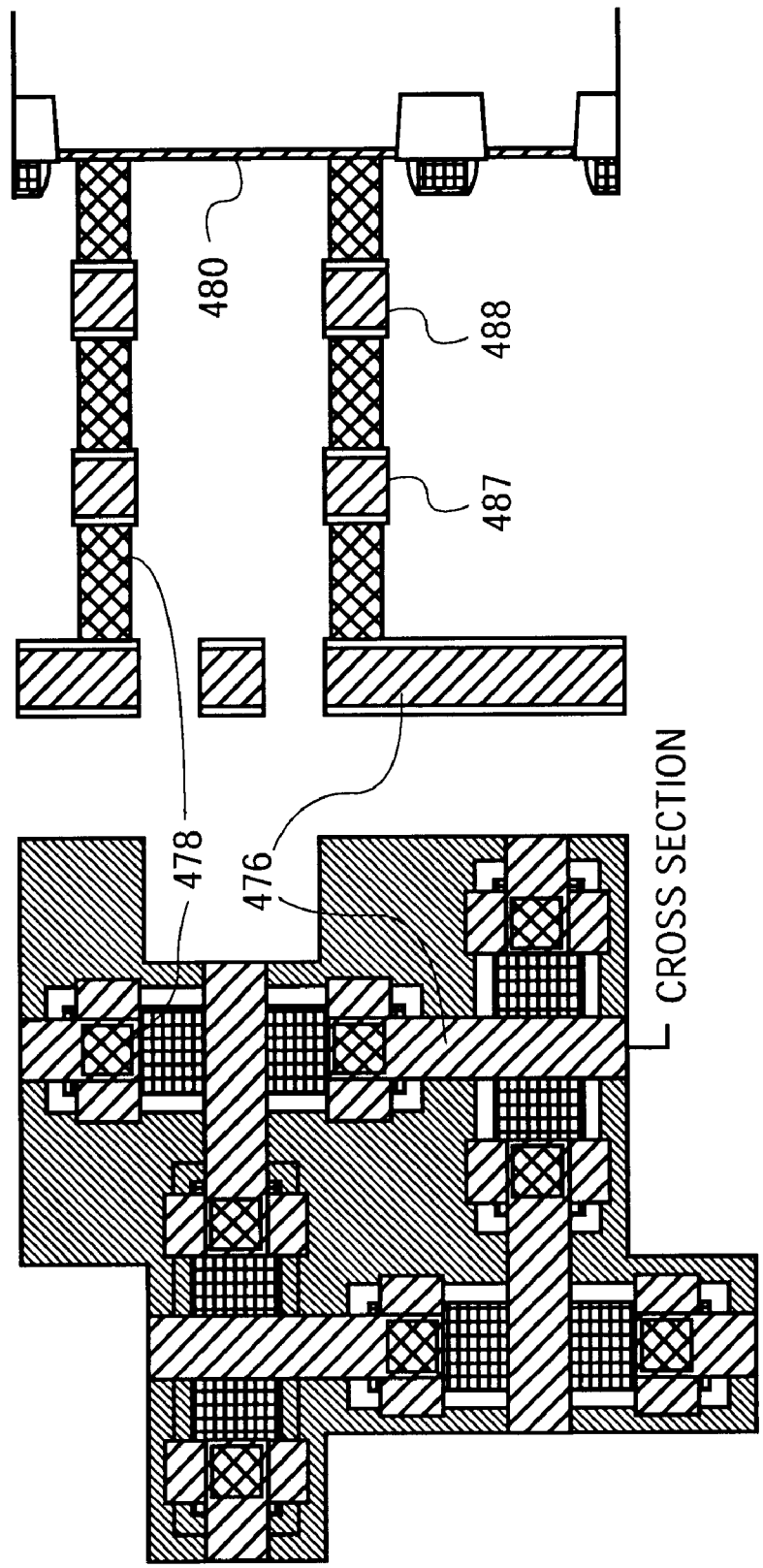
FIG. 6(b) shows a test structure that can be used to detect defects in the stacked via chains of a wafer.

FIG. 6(b) is an alternative test structures that can be used to detect defects in the stacked via chains of a wafer. The upper conduction segment 476 is composed of a first metal layer, the lower conduction segment 480 is composed of a second metal layer, and the contact via is composed of tungsten. The stacked via chains connect the upper conduction segment 476 to a first intermediate conduction layer 487, a second intermediate conduction layer 488, and the lower conduction segment 480.

Figure 6C:
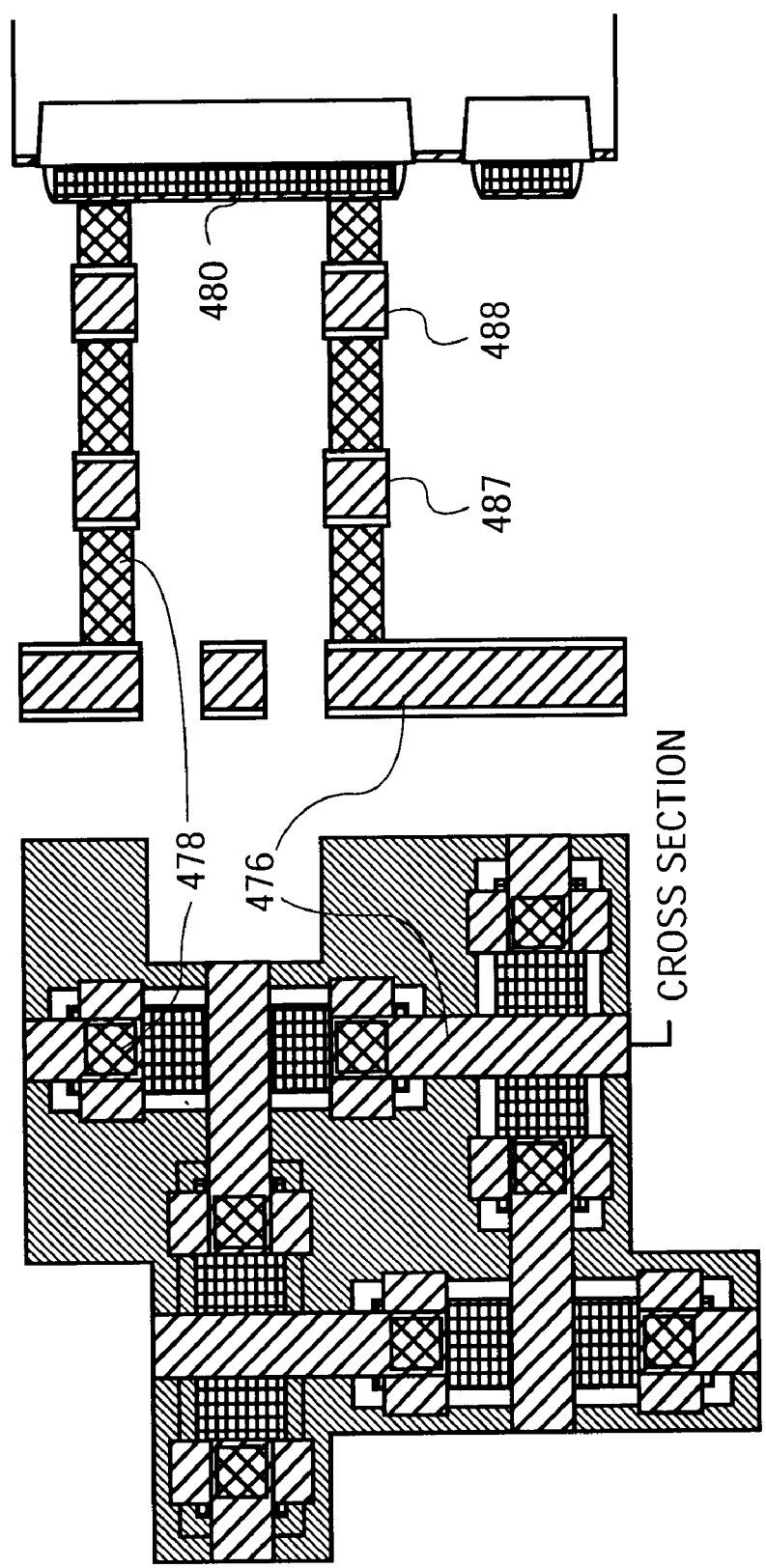
FIG. 6(c) shows a test structure that can be used to detect defects in the stacked via chains of a wafer.

FIG. 6(c) is an alternative test structures that can be used to detect defects in the stacked via chains of a wafer. The upper conduction segment 476 is composed of a third metal layer, the lower conduction segment 480 is composed of a polysilicon layer, and the contact via is composed of tungsten. The stacked via chains connect the upper conduction segment 476 to a first intermediate conduction layer 487, a second intermediate conduction layer 488, and the lower conduction segment 480.

Figure 7A:
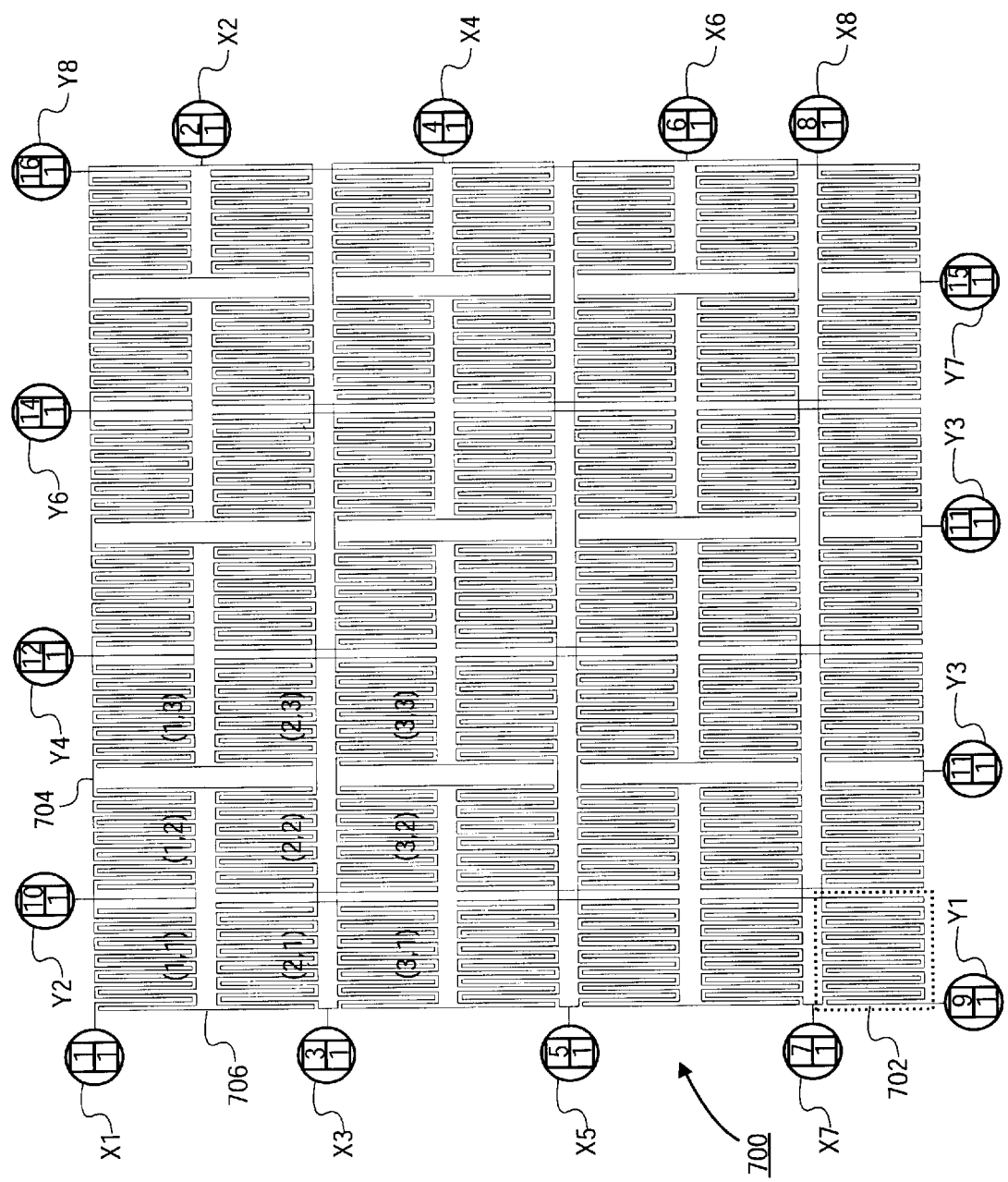
FIG. 7(a) shows a test chip for detecting open-circuit and short-circuit defects of conduction layers.

FIG. 7(a) shows a test chip 700 for detecting open-circuit and short-circuit defects of conduction layers. Test chip 700 includes forty-nine conduction units 702 and sixteen test pads. Each conduction unit 702 is composed of closely-spaced meander-style conduction lines, the details of which are shown in FIG. 7(c). Test chip 700 includes two sets of test pads. Test pads X1, X2, X3, X4, X5, X6, X7, and X8 are electrically connected together by conduction line 704. Test pads Y1, Y2, Y3, Y4, T5, Y6, Y7, and Y8 are connected together by conduction line 706.

By measuring the conductivity between the test pads Y1 and Y2, an open circuit defect located within the first column of conduction units can be detected. By measuring the conductivity between the test pads X1 and X2, an open circuit defect located within the first row of conduction units can be detected. If the connectivity between test pads Y1 and Y2 is broken, and the connectivity between test pads X1 and X2 is also broken, while conduction paths through other columns and rows are intact, then it can be inferred that there is a defect in the conduction unit (1,1). The location of defects in any of the other forty-eight conduction units can be determined in a likewise manner.

If there is a leakage current between the first set of test pads and the second set of test pads, then there is a short-circuit defect. The location of the short-circuit defect is found by measuring leakage currents I(i, j) (i=1 ... 7, j=1 ... 7), and finding the "local maximum" of the currents. This is similar to the method described in relation to FIG. 4(a).

Figure 7B:
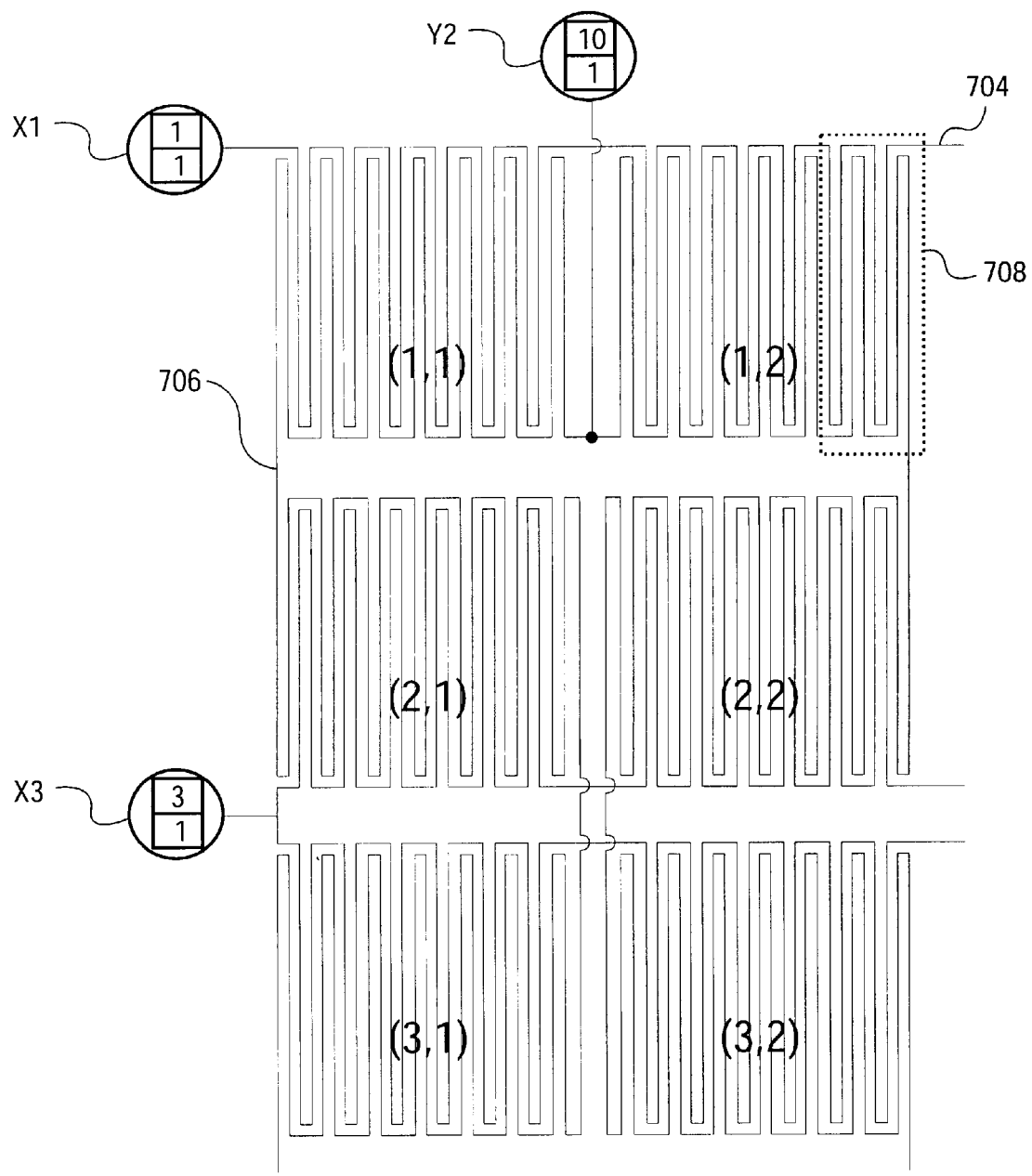
FIG. 7(b) shows an enlarged diagram of six conduction units of a test chip 700.
Figure 7C:
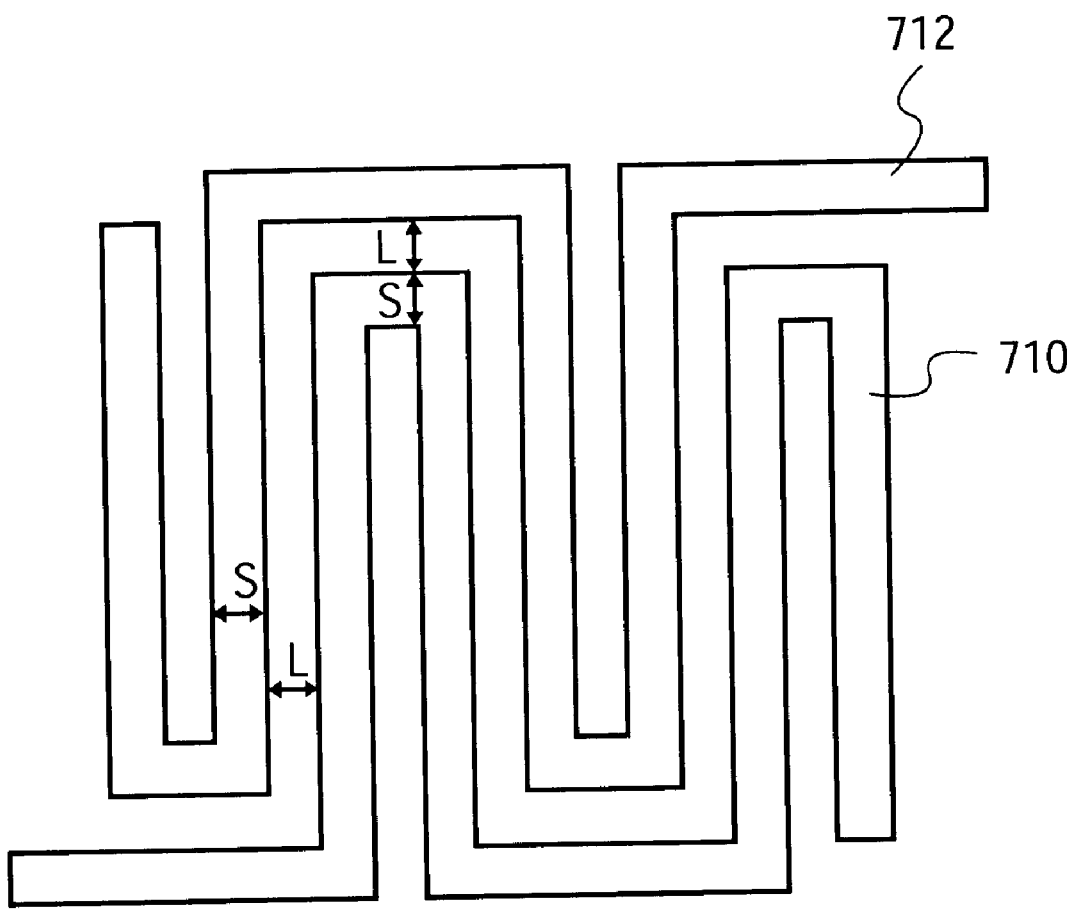
FIG. 7(c) shows an enlargement of a conduction unit as shown in FIG. 7(a)

FIG. 7(b) shows an enlarged diagram of six conduction units of the test chip 700. An enlargement of a portion 708 of the conduction unit 702 is shown in FIG. 7(c). The conduction unit 702 comprises two meander-style conduction lines 710 and 712. The figure is not shown to scale. The minimum design rule is used for the conduction units. Preferably, the width "L" of the conduction lines and the spacing "S" between the conduction lines are at least twice the minimum design rule.

Figure 8A:
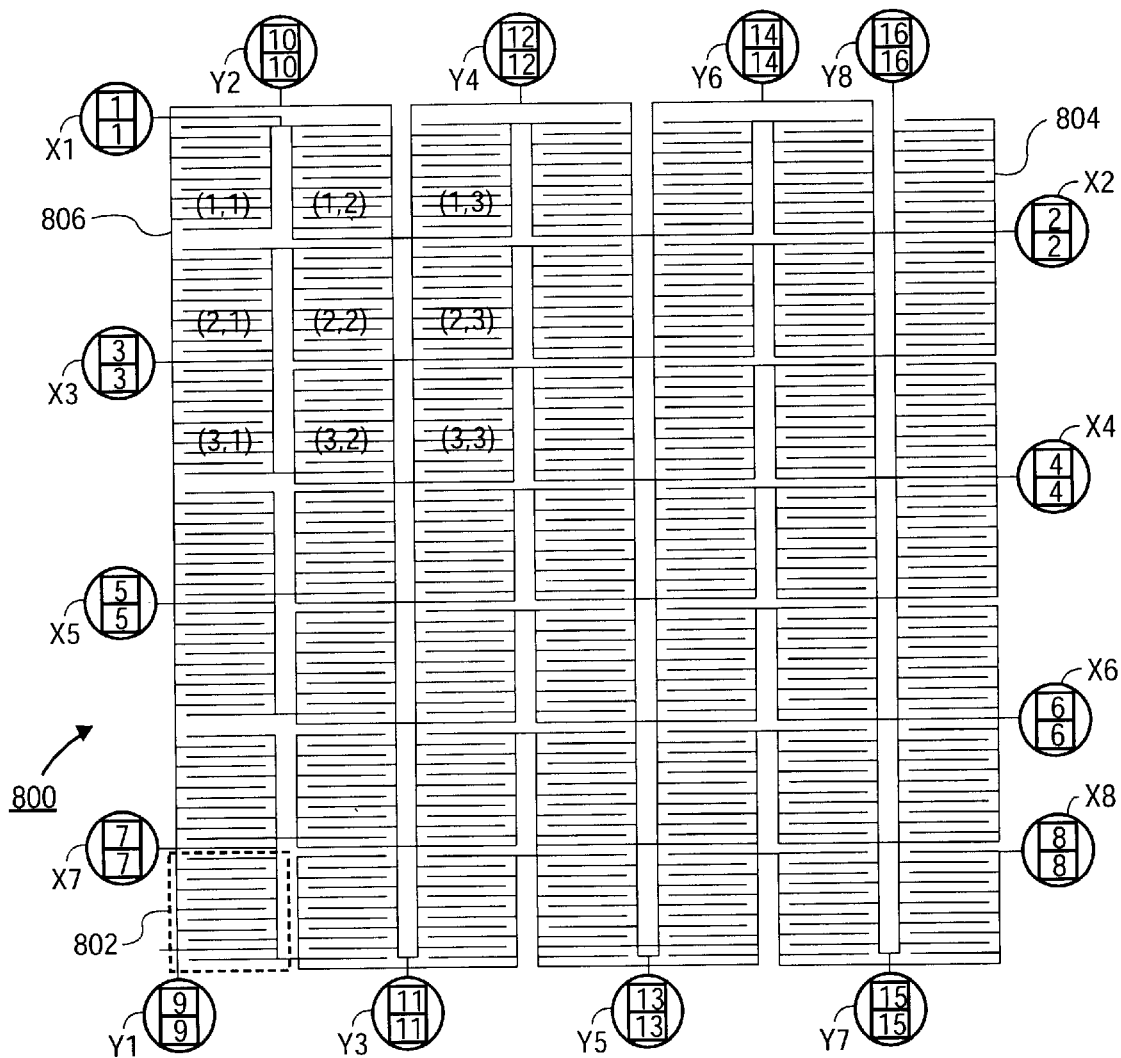
FIG. 8(a) shows a test chip for monitoring defects with the conduction lines having the maximum line width and minimum spacing between lines allowed by the design rules.

FIG. 8(a) shows a test chip 800 for monitoring defects with the conduction lines having the maximum line width and minimum spacing between lines allowed by the design rules. Test chip 800 can also be used to monitor the leakage current between well regions, between P-plus doping regions, between N-plus doping regions, and between P-plus and N-plus junctions. Test chip 800 includes forty-nine conduction units 834 and sixteen test pads. Each conduction unit 802 is composed of an array of closely-spaced comb-style conduction lines, the details of which are shown in FIGS. 8(c), (d). Test chip 800 includes two sets of test pads. A first set of test pads include test pads X1, X2, X3, X4, X5, X6, X7, and X8; they are connected together by conduction line 804. A second set of test pads includes test pads Y1, Y2, Y3, Y4, Y5, Y6, Y7, and Y8; they are electrically connected together by conduction line 806.

If there is a leakage current between the first set of test pads and the second set of test pads, then there is a short-circuit defect. The location of the short-circuit defect is found by measuring leakage currents I(i, j) (i=1 ... 7, j=1 ... 7), and finding the "local maximum" of the currents. This is similar to the method described in relation to FIG. 4(a).

Figure 8B:
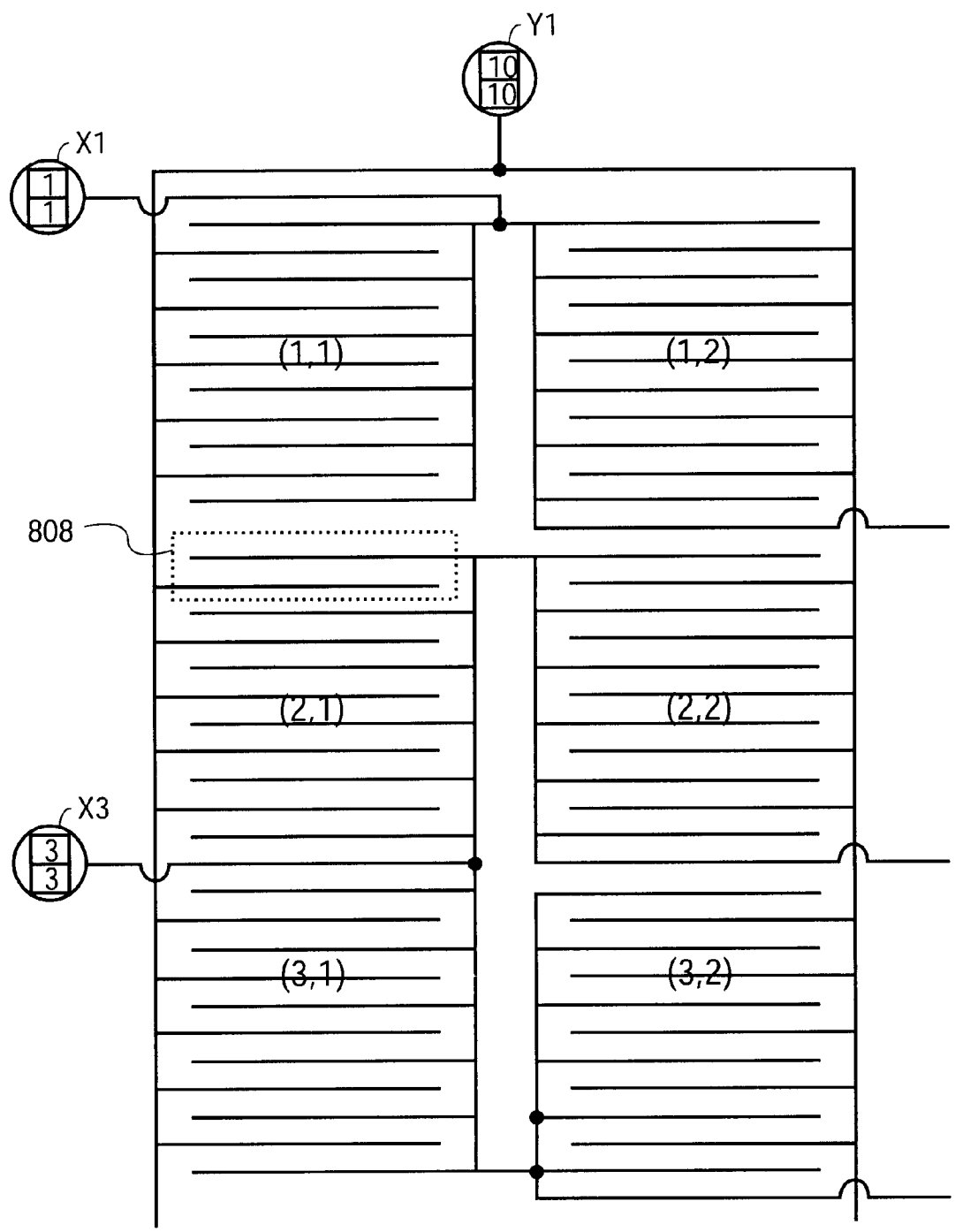
FIG. 8(b) shows an enlarged diagram of six conduction units of the a chip.
Figure 8C:
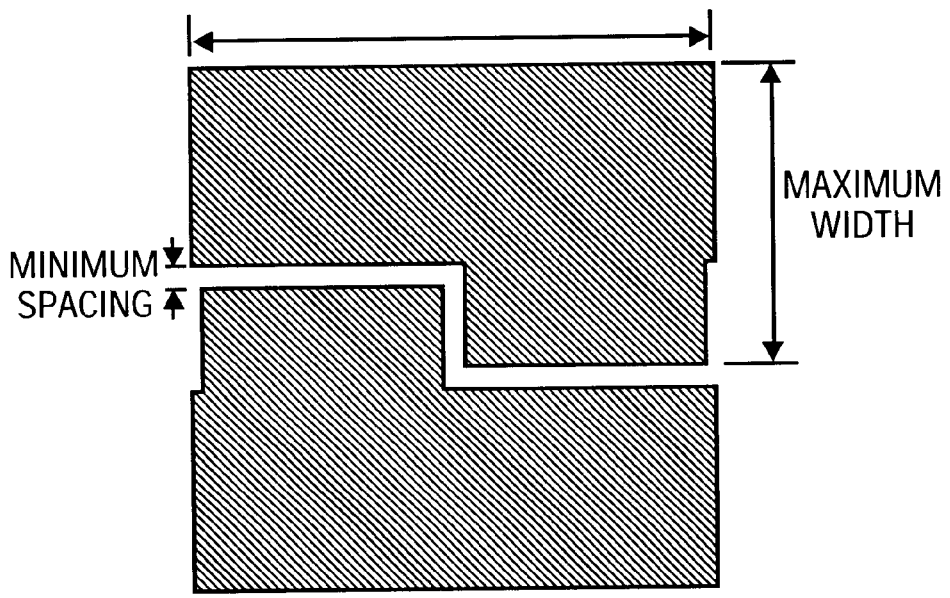
FIGS. 8(c) and (d) show the basic components of a testing structure.
Figure 8D:
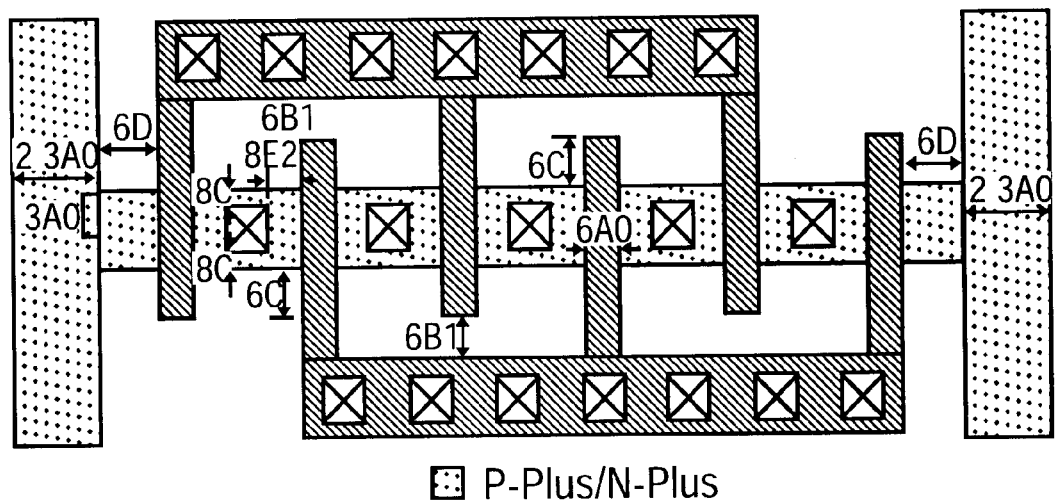

FIG. 8(b) shows an enlarged diagram of six conduction units of the test chip 800. An enlargement of the portion 808 is shown in FIGS. 8(c) and (d).

FIGS. 8(c) and (d) shows the basic components of the testing structure.

Figure 9:
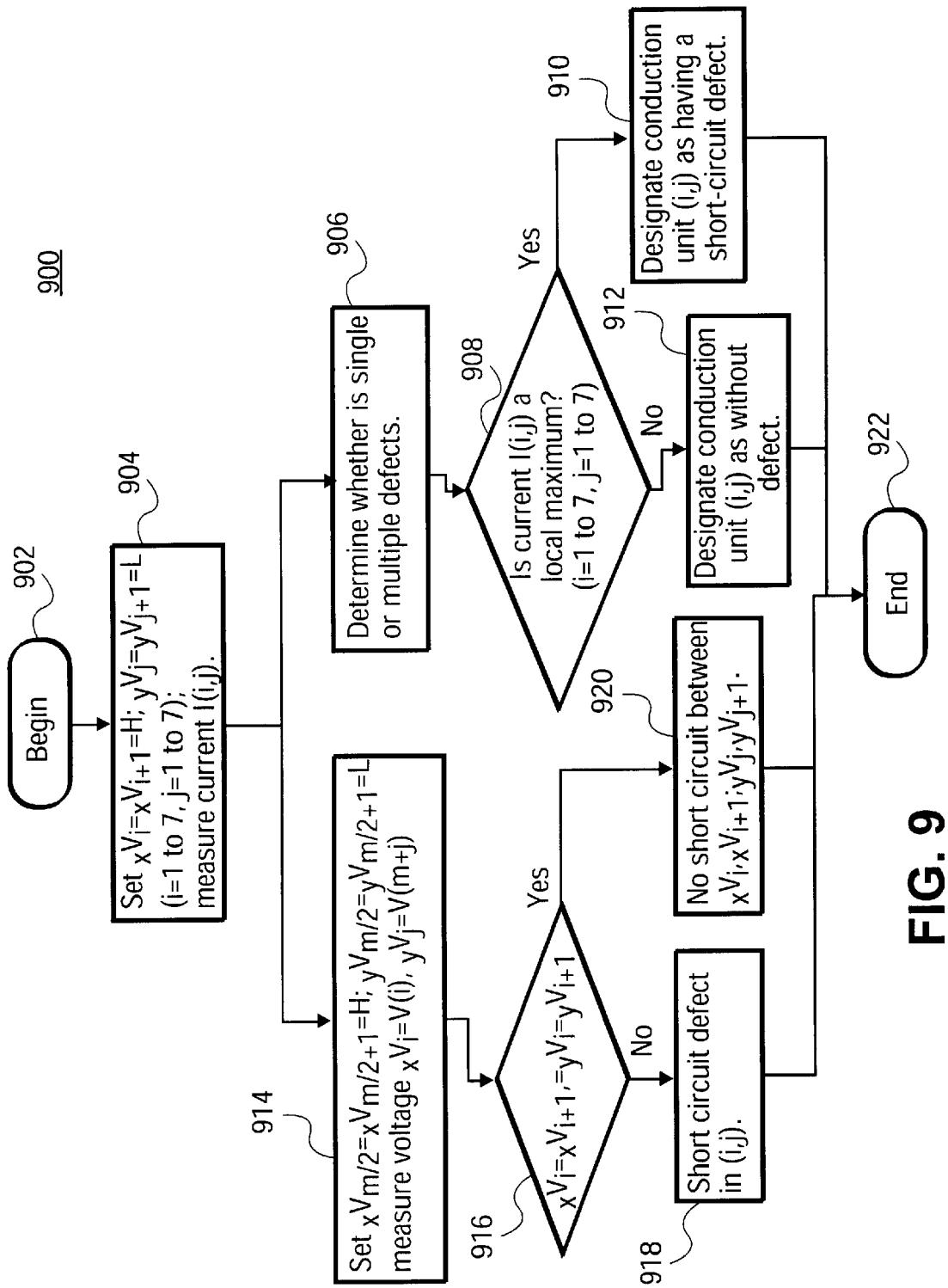
FIG. 9 is a flowchart of a process for determining whether there is a short-circuit defect in the conduction units of a test chip.

FIG. 9 is a flowchart of a process for determnining whether there is a short-circuit defect in the conduction units of a test chip. The test chip may be either test chip 400, test chip 700, or test chip 800. In box 904, the resistance between a pair of X test pads and a pair of Y test pads is determined. The test pads X(i), X(i+1) are set to voltage, preferably 1.0 to 3.3 volts, and test pads Y(j), Y(j+1) are set to low voltage, preferably ground voltage. The current flowing from test pads X(i), X(i+1) to Y(i), Y(j+1) are measured and stored as I(i, j). The resistance R(i, j)=V/I(i, j) represents the resistance between test pad pair X(i), X(i+1) and test pad pair Y(i), Y(j+1). The variables "i" and "j" runs from 1 to 7 in this example. In other applications, the number of current measurements varies according to the number of conduction units. After all the current measurements are taken, the control flow goes to box 906. In box 906, a determination is made as to whether there is a single defect or multiple defects in the test chip. In box 908, each current data I(i, j) is compared with I(i−1, j−1), I(i−1, j), I(i−1, j+1), I(i, j−1), I(i, j+1), I(i+1, j−1), I(i+1, j−1), I(i+1, j), and I(i+1, j+1) to determine whether I(i, j) is a local minimum. Comparison of an item I( ) is omitted if "i−1" or "j−1" is smaller than 1.

Alternatively, the resistance R(i, j) can be compared with R(i–1, j–1), R(i–1, j), R(i–1, j+1), R(i, j–1), R(i, j+1), R(i+1, j–1), R(i+1, j–1), R(i+1, j), and R(i+1, j+1) to determine whether R(i, j) is a local minimum. Comparison of an item R( ) is omitted if "i–1" or "j–1" is smaller than 1. If I(i, j) is a local minimum, then control of the process goes to box 910. In box 910, the conduction unit (i, j) is designated as having a short-circuit defect. If I(i, j) is not a local minimum, then control of the process goes to box 912. In box 912, the conduction unit (i, j) is designated as without any short-circuit defect. The process ends in box 922.

Figure 10:
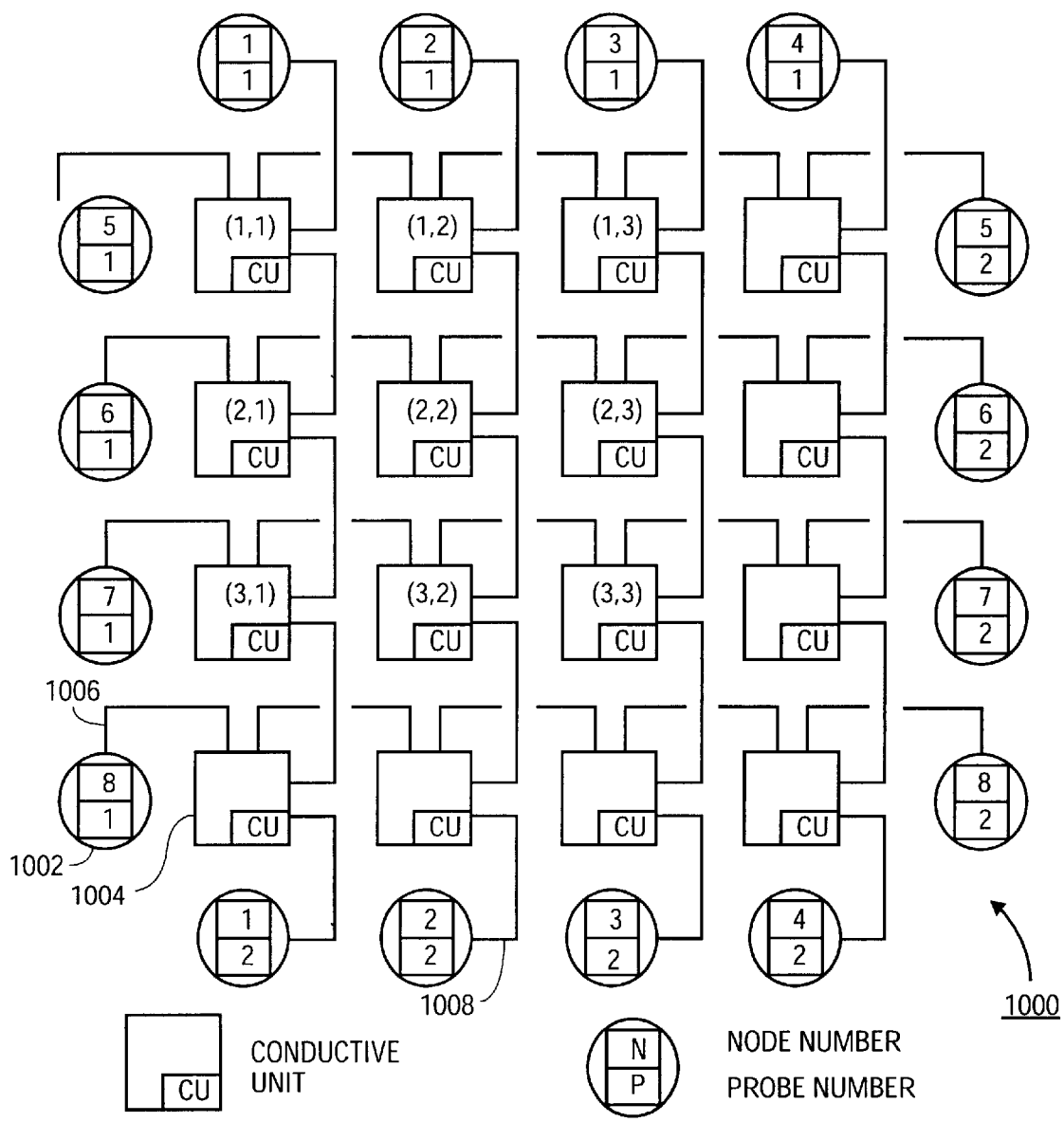
FIG. 10 shows a diagram of a test chip including sixteen test pads and sixteen conduction units arranged in a 4-by-4 array.

FIG. 10 shows a diagram of a test chip 1000 including sixteen test pads 1002 and sixteen conduction units 1004 arranged in a 4-by-4 array. The test pads 1002 includes two sets of tests pads. A first set of test pads include the four test pads on the left side of the array, and four test pads on the right side of the array. Each test pad on the left side is connected to a test pad on the right side of the array by a conduction line 1006 that runs through a row of four conduction units. A second set of test pads include the four test pads on the upper side of the array, and four test pads on the lower side of the array. Each test pad on the upper side of the array is connected to a test pad on the lower side of the array by a conduction line 1008 that runs through a column of four conduction units 1004.

The structure of conduction unit 1004 varies according application, such as whether short circuit defects or open circuit defects are being tested, and whether contact vias and stacked via chains are being tested. The conduction unit 1004 may also vary according to whether defects in a conduction layer or defects in contact vias are being tested. The first row (or the uppermost row) of conduction units 1004 are labeled (1,1), (1,2), (1,3), and so on. The first column (or the leftmost column) of conduction units 1004 are labeled (1,1), (2,1), (3,1), and so on.

Figure 11:
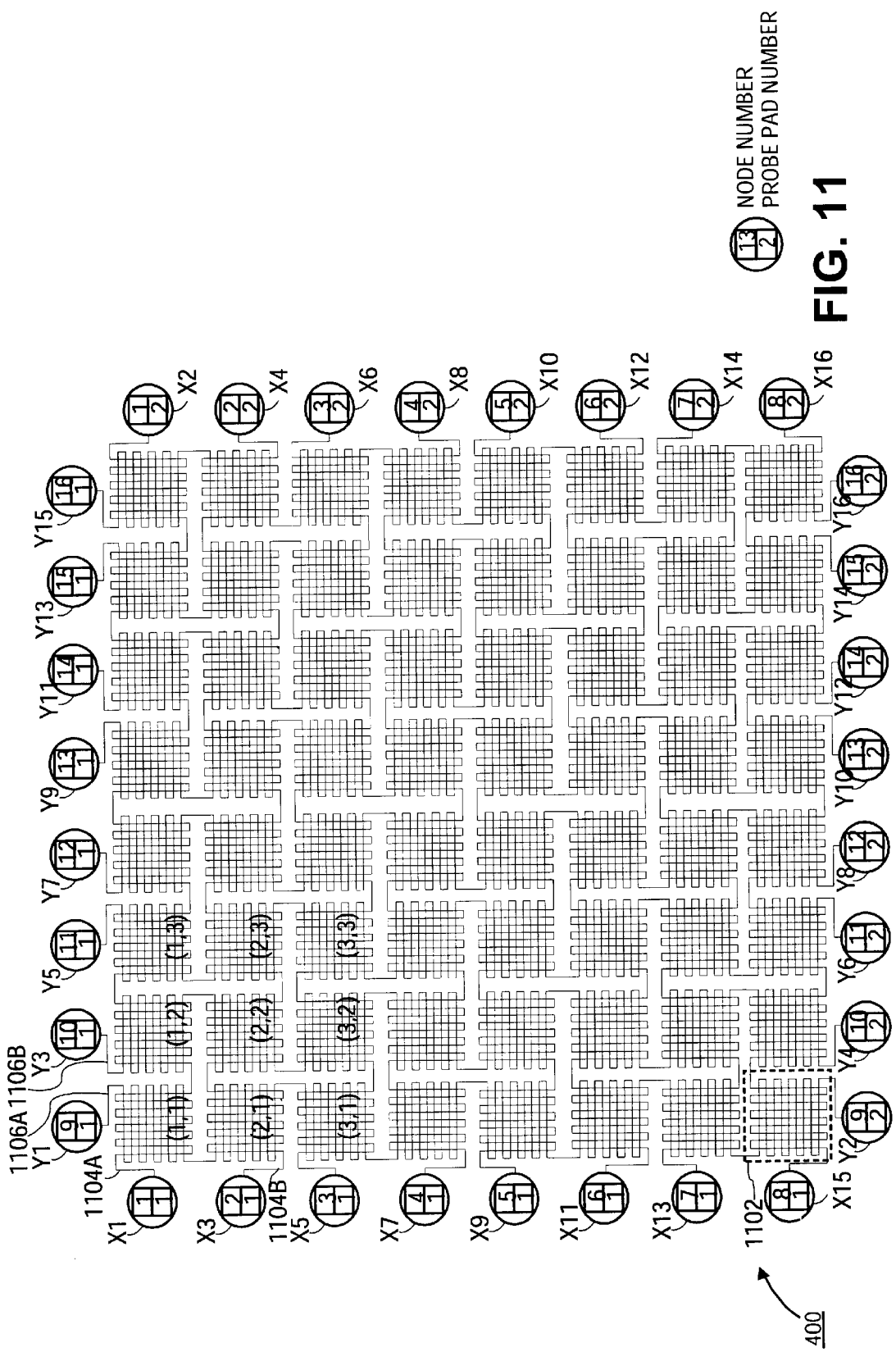
FIG. 11 shows a test chip including sixty-four conduction units and thirty-two test pads for detecting open- and short-circuit defects in contact vias and stacked via chains.

FIG. 11 shows a test chip 1100 including sixty-four conduction units 1102 and thirty-two test pads for detecting open- and short-circuit defects in contact vias and stacked via chains. Each conduction unit 1102 is composed of an array of intermeshed conduction paths. Test chip 1100 includes two sets of test pads. A first set of test pads includes the test pads on the left side of the array, X1, X3, X5, X7, X9, X11, X13, X15, and on the right side of the array, X2, X4, X6, X8, X10, X12. X14, and X16. Test pads X1 and X2 are connected by conduction path 1104a, and test pads X3 and X4 are connected by conduction path 1104b, etc. The second set of test pads include the test pads on the upper side of the array, Y1, Y3, Y5, Y7, Y9, Y11, Y13, Y15, and on the lower side of the array, Y2, Y4, Y6, Y8, Y10, Y12, Y14, and Y16. Test pads Y1 and Y2 are connected by conduction path 1106a, and test pads Y3 and Y4 are connected by conduction path 1106b, etc.

By measuring the conductivity between the test pads Y1 and Y2, any open circuit defect located within the first column of conduction units can be detected. By measuring the conductivity between the test pads X1 and X2, any open circuit defect located within the first row of conduction units can be detected. If the connectivity between test pads X1 and X2 is broken, and the connectivity between test pads Y1 and Y2 is also broken, while the conduction paths in all other rows and columns are intact, then it may be inferred that there is a defect in the conduction unit (1,1). The location of open-circuit defects in any of the sixty-four conduction units can be determined in a likewise manner.

To determine whether there is a short-circuit defect, a pair of test probes are first applied to test pads X1 and Y1. Test pad X1 is set to high voltage, and test pad Y1 is set to ground voltage. Typically, a current limiter is used in such tests in case of a short circuit to prevent excessive current from damaging the test equipment. If the current flowing between test pads X1 and Y1 is below a certain threshold, then conduction unit (1,1) does not have a short-circuit defect. If the current is above the threshold, then there is a short-circuit defect. Next, the test probe on Y1 is moved to Y2, with X1 set to high voltage, and Y2 set to ground voltage. The current between the two test pads is measured, and a short-circuit defect is detected if the current is above the threshold level. In a likewise manner, the short-circuit defects within all the other sixty-two conduction units can be found.

The details of the conduction unit 1102 are similar to the one shown in FIG. 4(c). Each conduction path is composed of upper conduction segments and lower conduction segments. The upper and lower conduction segments are connected by contact vias. Any defects in the contact vias will cause the conductivity of the conduction paths to be broken. Thus, this testing circuit is suitable for finding defects that occurred in the contact via processing steps. The details of the contact via structures are similar to those shown in FIGS. 5(a), 5(b), 6(a), 6(b), and 6(c).

Figure 12A:
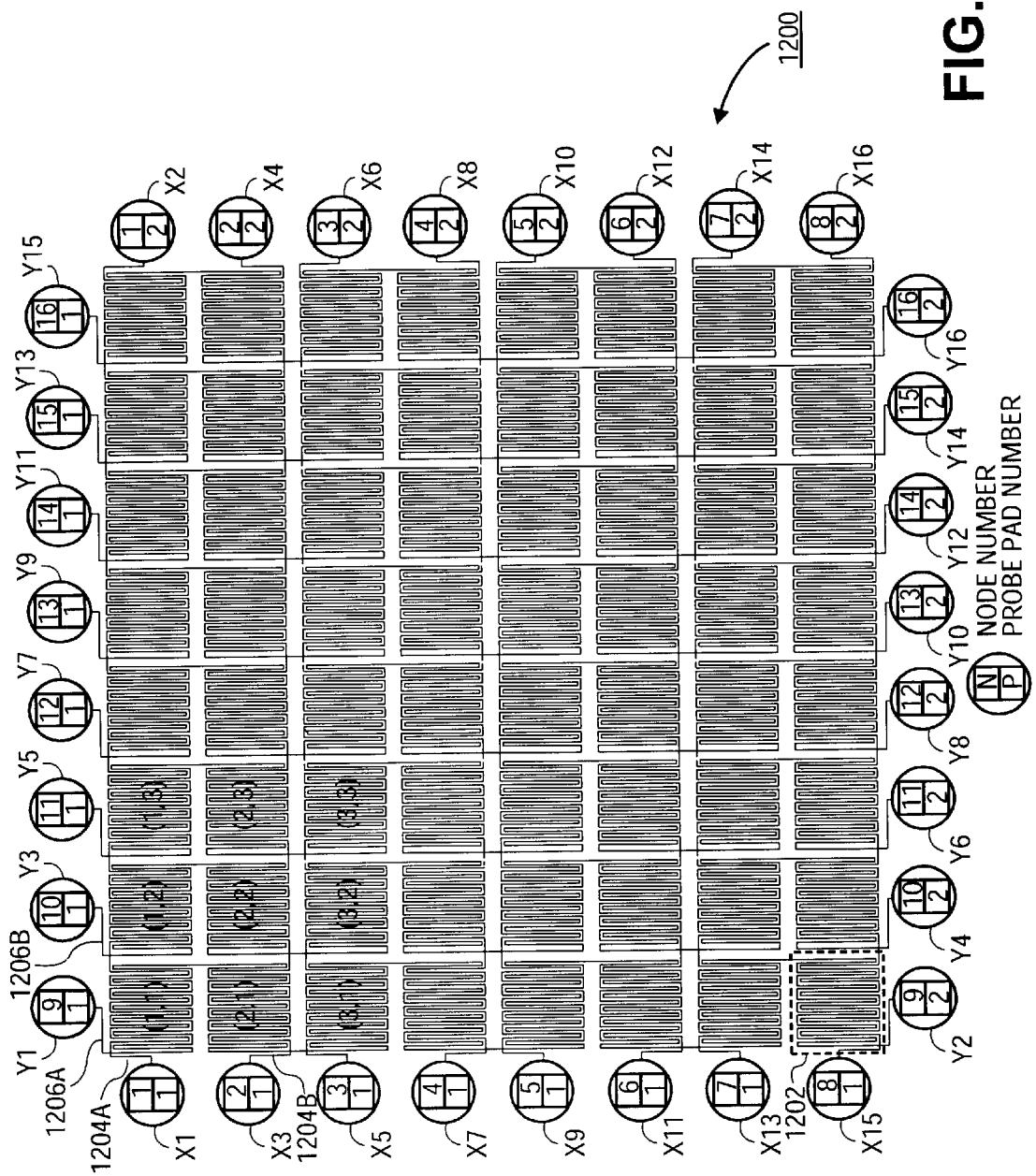
FIG. 12(a) shows a test chip for detecting open-circuit and short-circuit defects of dense conduction layers.

FIG. 12(a) shows a test chip 1200 for detecting open-circuit and short-circuit defects of dense conduction layers. Test chip 1200 includes sixty-four conduction units 1202 and thirty-two test pads. Each conduction unit 1202 is composed of closely-spaced meander-style conduction lines, the details are similar to the ones shown in FIG. 7(c). Test chip 1200 includes two sets of test pads. The first set of test pads include the left test pads X1, X3, X5, X7, X9, X11, X13, X15, and the right test pads X2, X4, X6, X8, X10, X12, X14, and X16. The second set of test pads include the upper test pads Y1, Y3, Y5, Y7, Y9, Y11, Y13, Y15, and the lower test pads Y2, Y4, Y6, Y8, Y10, Y12, Y14, and Y16. Test pads X1 and X2 are connected by conduction path 1204a, and test pads X3 and X4 are connected by conduction path 1204b, etc. Test pads Y1 and Y2 are connected by conduction path 1206a, and test pads X3 and X4 are connected by conduction path 1206b, etc.

By measuring the conductivity between the test pads Y1 and Y2, an open-circuit defect located within the first column of conduction units can be detected. By measuring the conductivity between the test pads X1 and X2, an open-circuit defect located within the first row of conduction units can be detected. If the connectivity between test pads Y1 and Y2 is broken, and the connectivity between test pads X1 and X2 is also broken, while conduction paths through other columns and rows are intact, then it can be inferred that there is a defect in the conduction unit (1,1). The location of defects in any of the other sixty-three conduction units can be determined in a likewise manner.

To determine whether there is a short-circuit defect, a pair of test probes are applied to test pads X1 and Y1. Test pad X1 is set to high voltage, and test pad Y1 is set to ground voltage. If the current flowing between test pads X1 and Y1 is below a certain threshold, then conduction unit (1,1) does not have a short-circuit defect. If the current is above a certain threshold, then there is a short-circuit defect. Next, the test probe on Y1 is moved to Y2, with X1 set to high, and Y2 set to ground voltage. The current between the two test pads is measured, and a short-circuit defect is detected if the current is above a certain threshold level. In a likewise manner, the short-circuit within all the other sixty-two conduction units can be found.

Figure 12B:
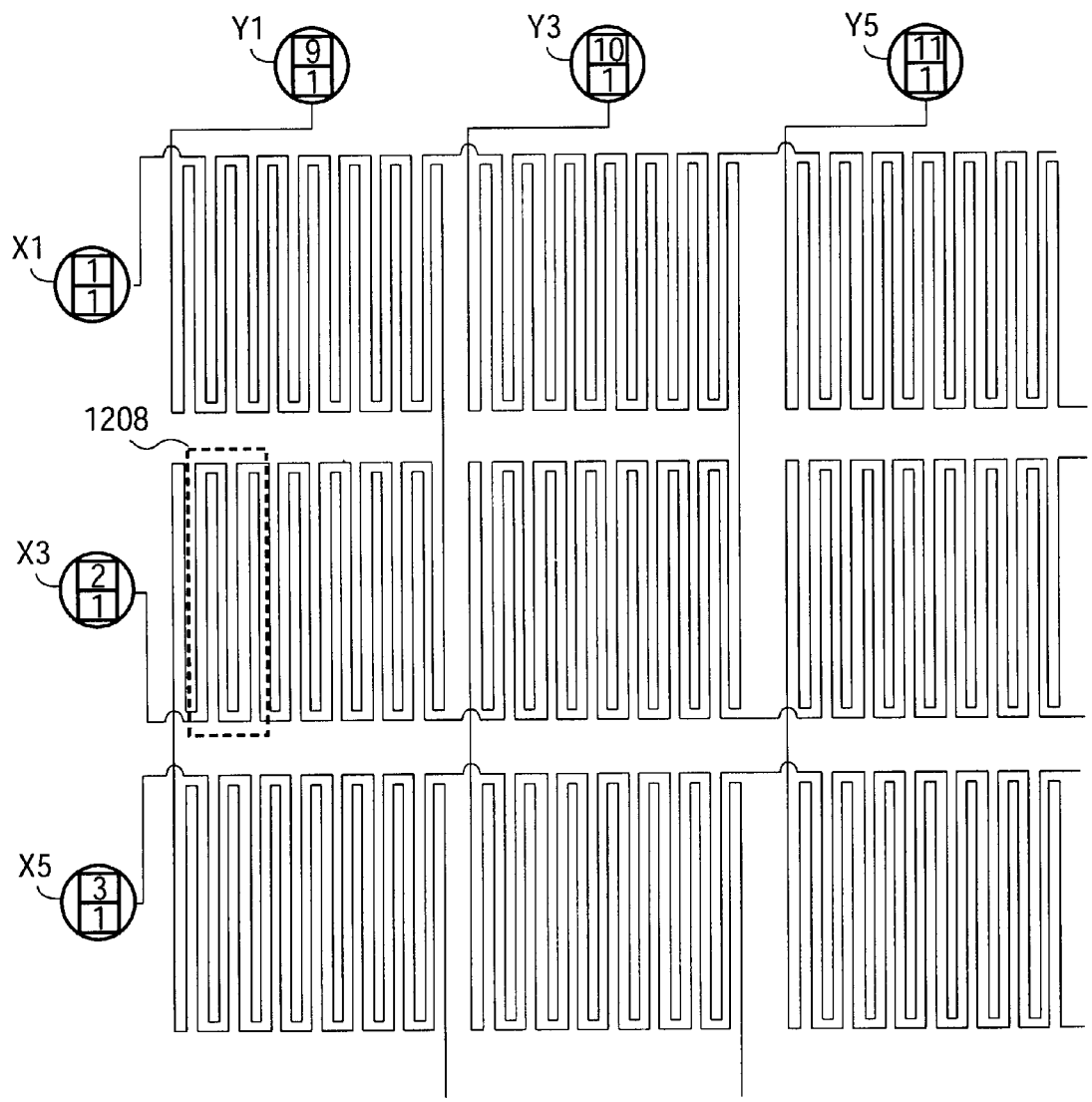
FIG. 12(b) shows an enlarged diagram of nine conduction units of a test chip.

FIG. 12(b) shows an enlarged diagram of nine conduction units 1202 of the test chip 1200. The portion 1208 of the conduction unit 1202 is similar to the one shown in FIG. 7(c).

Figure 13A:
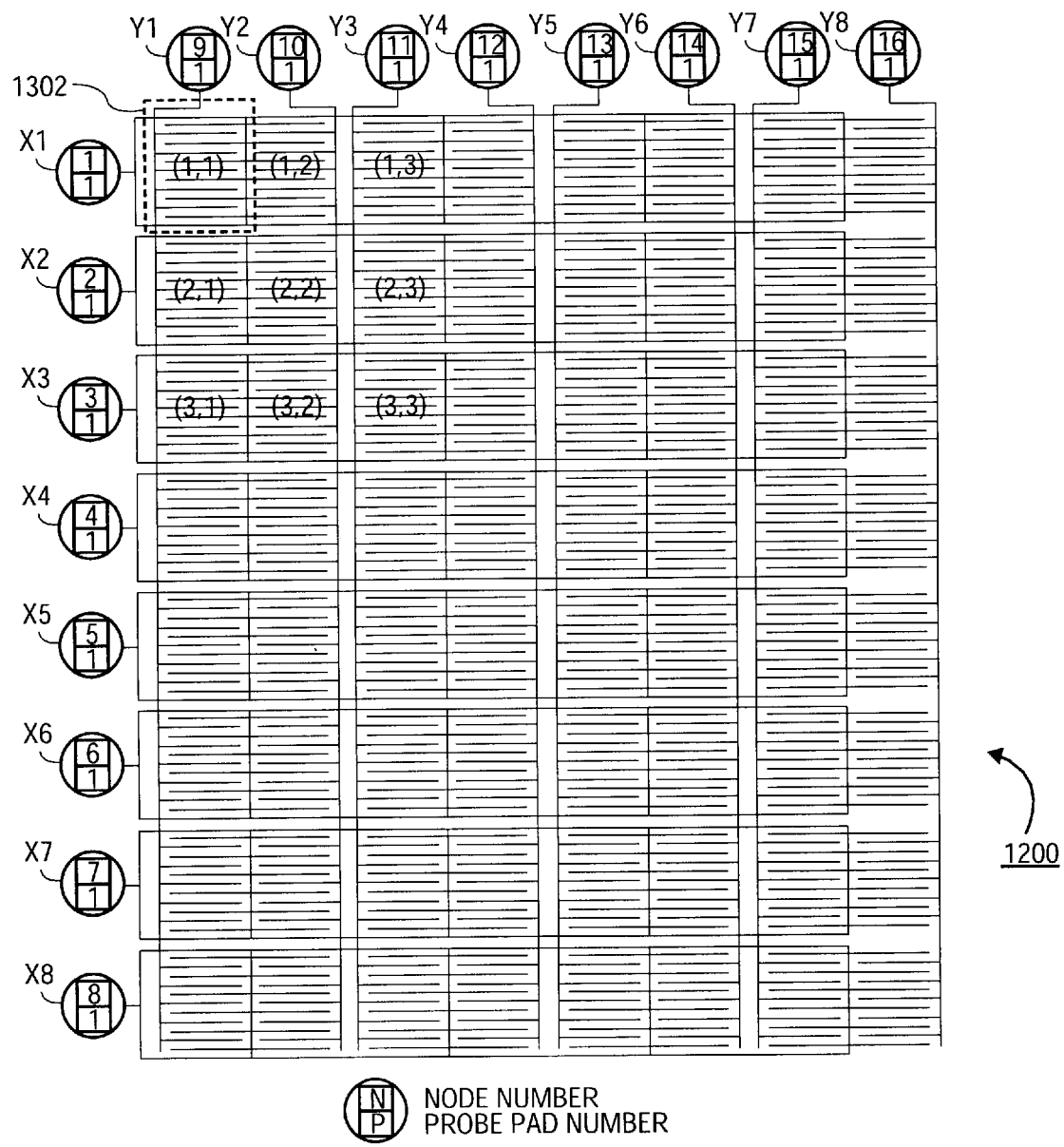
FIG. 13(a) shows a test chip for monitoring defects with the conduction lines having the maximum line width and minimum spacing between lines allowed by the design rules.
Figure 13B:
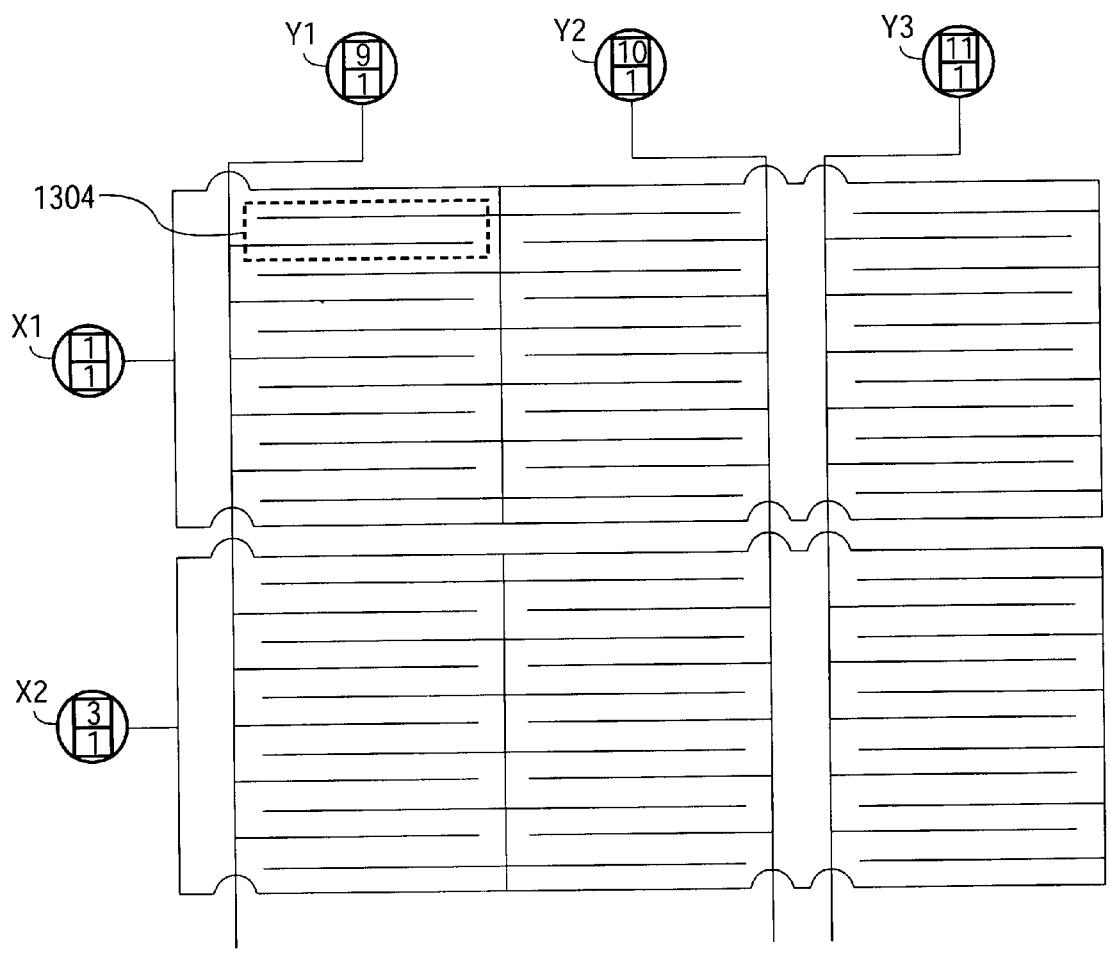
FIG. 13 (b) shows an enlargement of an array of conduction units as shown in FIG. 13(a).

FIG. 13(a) shows a test chip 1300 for monitoring defects with the conduction lines having the maximum line width and minimum spacing between lines allowed by the design rules. Test chip 1300 can also be used to monitor the leakage current between well regions, between P-plus doping regions, between N-plus doping regions, and between P-plus and N-plus junctions. Test chip 1300 includes sixty-four conduction units 1302 and sixteen test pads. Each conduction unit 1302 is composed of an array of closely-spaced comb-style conduction paths, the details of which are shown in FIG. 13(b). An enlargement of a portion 1304 of FIG. 13(b) is shown in FIG. 8(c). Test chip 1300 includes two sets of test pads. A first set of test pads include the left side test pads X1, X2, X3, X4, X5, X6, X7, and X8. Each X test pad is connected to a row of conduction units. A second set of test pads includes the upper side test pads Y1, Y2, Y3, Y4, Y5, Y6, Y7, and Y8. Each Y test pad is connected to a column of conduction units.

To determine whether there is a short-circuit defect, a pair of test probes are applied to test pads X1 and Y1. Test pad X1 is set to high voltage, and test pad Y1 is set to ground voltage. If the current flowing between test pads X1 and Y1 is below a certain threshold, then conduction unit (1,1) does not have a short-circuit defect. If the current is above a certain threshold, then there is a short-circuit defect. Next, the test probe on Y1 is moved to Y2, with X1 set to high, and Y2 set to ground voltage. The current between the two test pads is measured, and a short-circuit defect is detected if the current is above a certain threshold level. In a likewise manner, the short-circuit within all the other sixty-two conduction units can be found.

Figure 14A:
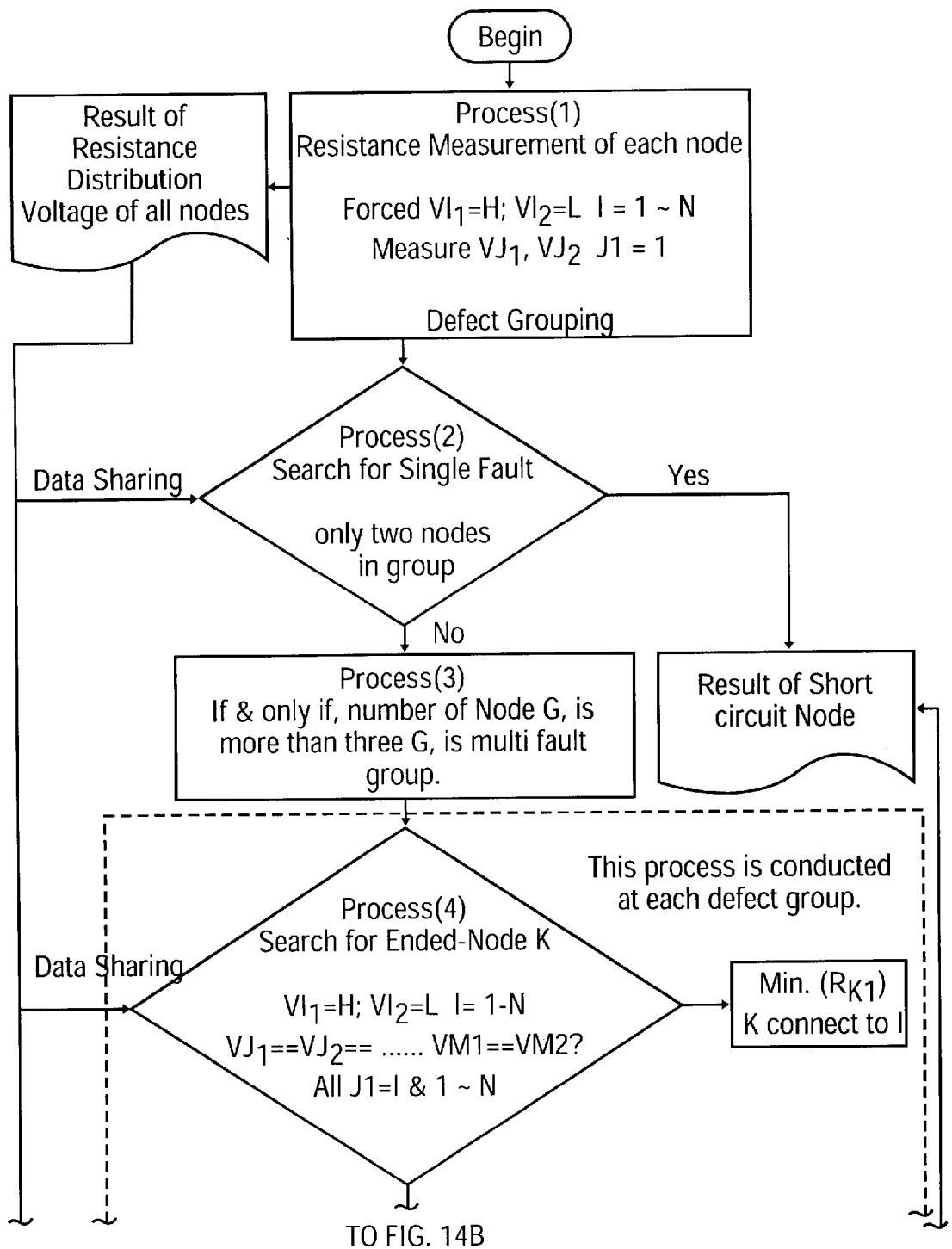
FIG. 14 is a flow diagram for the method of determining the short-circuit defects using the test chips.
Figure 14B:
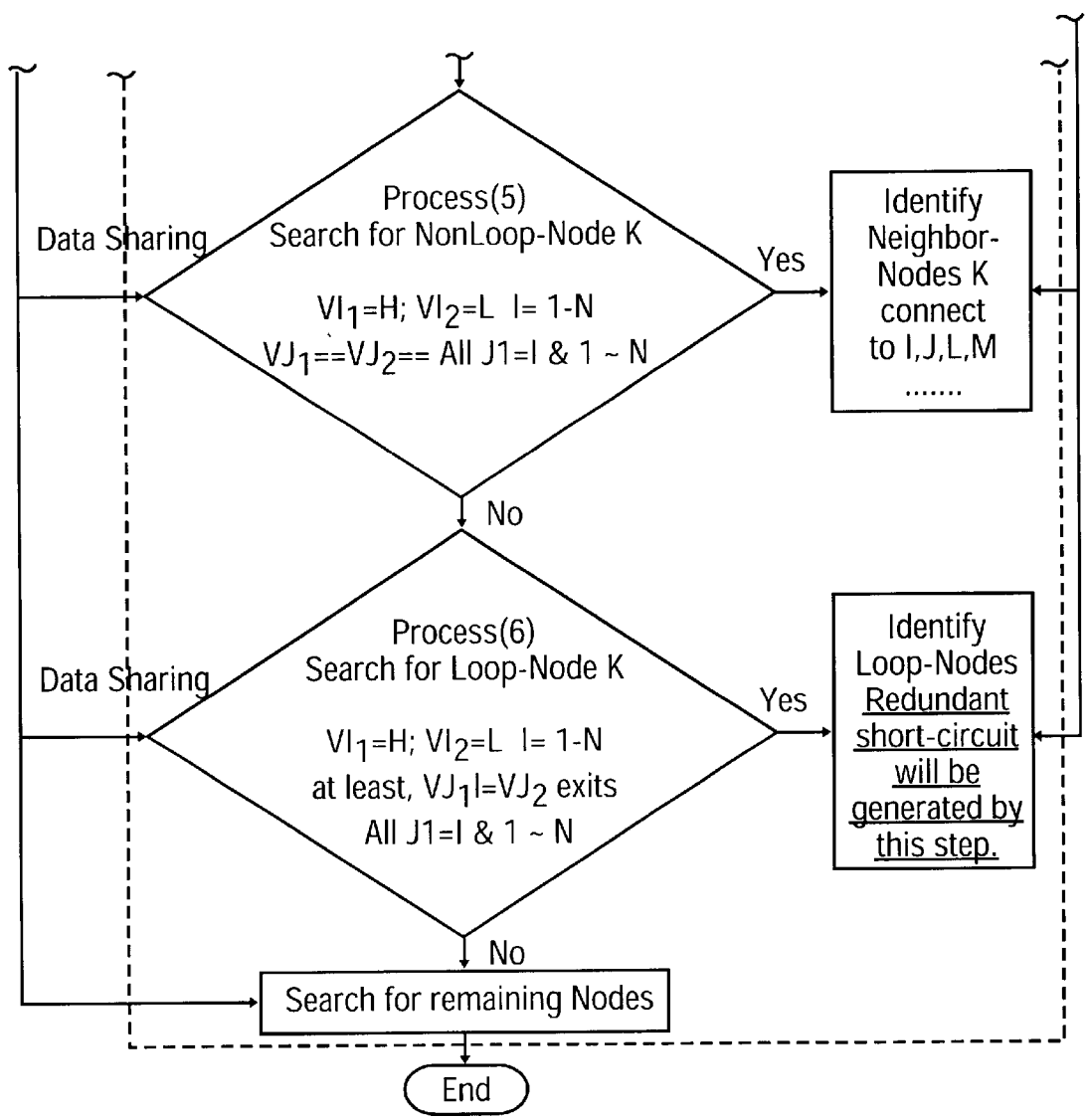

FIG. 14 is a flow diagram for the method of determining the short-circuit defects using the test chips 1100, 1200, and 1300.

Figure 15:
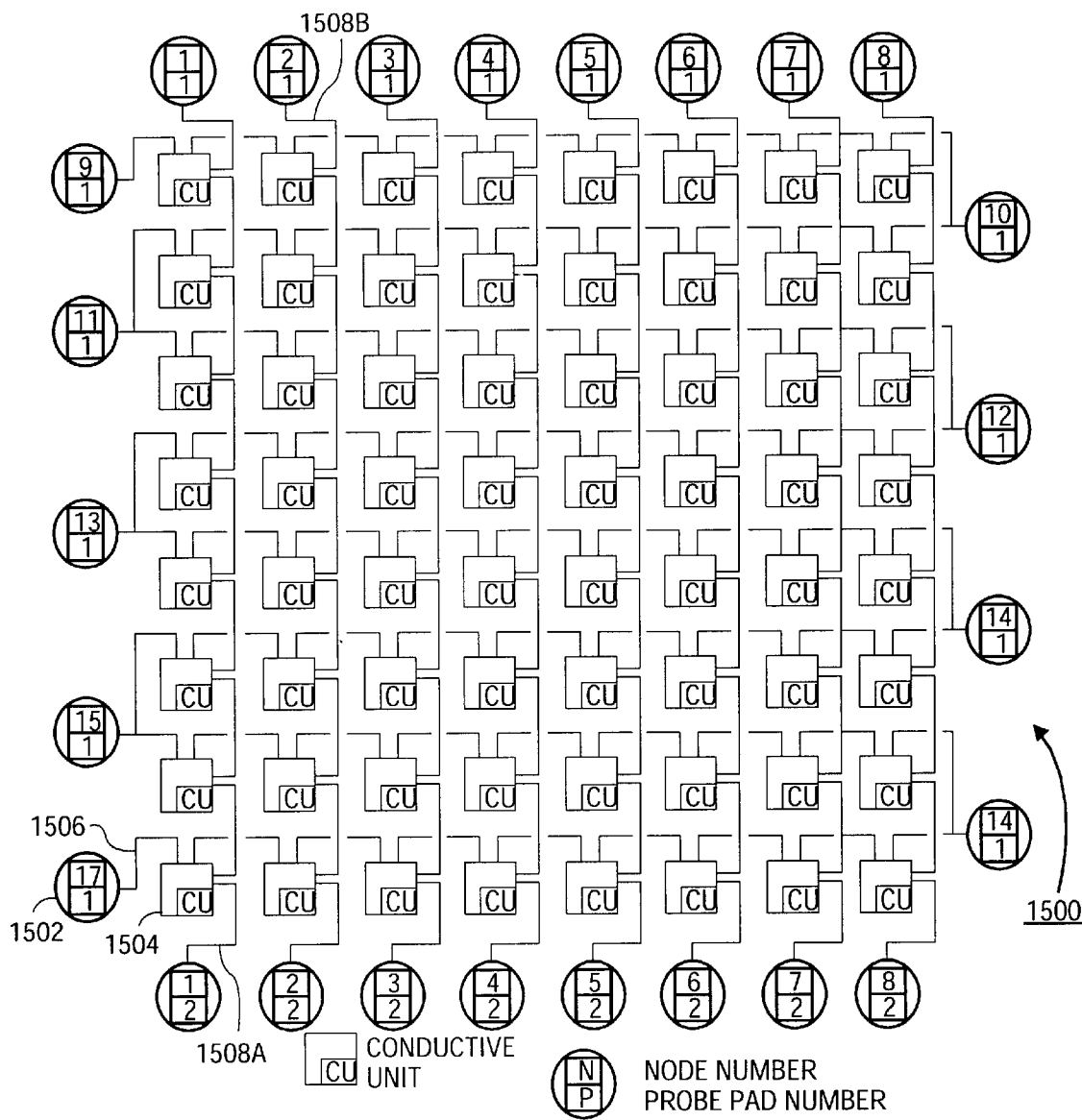
FIG. 15 shows a schematic diagram of a test chip including twenty-five test pads and sixty-four conduction units arranged in an 8-by-8 array.

FIG. 15 shows a schematic diagram of a test chip 1500 including twenty-five test pads 1502, and sixty-four conduction units 1504 arranged in an 8-by-8 array. The test pads 1502 includes two sets of tests pads: a first set of test pads include the five test pads on the left side of the array, and four test pads on the right side of the array. All of the first set of test pads are connected together by a conduction path 1506. A second set of test pads include the eight test pads on the upper side of the array, and eight test pads on the lower side of the array. Each test pad on the upper side is connected to a test pad on the lower side of the array by a conduction line 1508 that runs through a column of right conduction units 1504.

The structure of conduction unit 1504 varies according application, such as whether short circuit defects or open circuit defects are being tested, and whether contact vias and stacked via chains are being tested. The conduction unit 1504 may also vary according to whether defects in a conduction layer or defects in contact vias are being tested. The first row (or the uppermost row) of conduction units 1504 are labeled (1,1), (1,2), (1,3), and so on. The first column (or the leftmost column) of conduction units 1504 are labeled (1,1), (2,1), (3,1), and so on.

Figure 16:
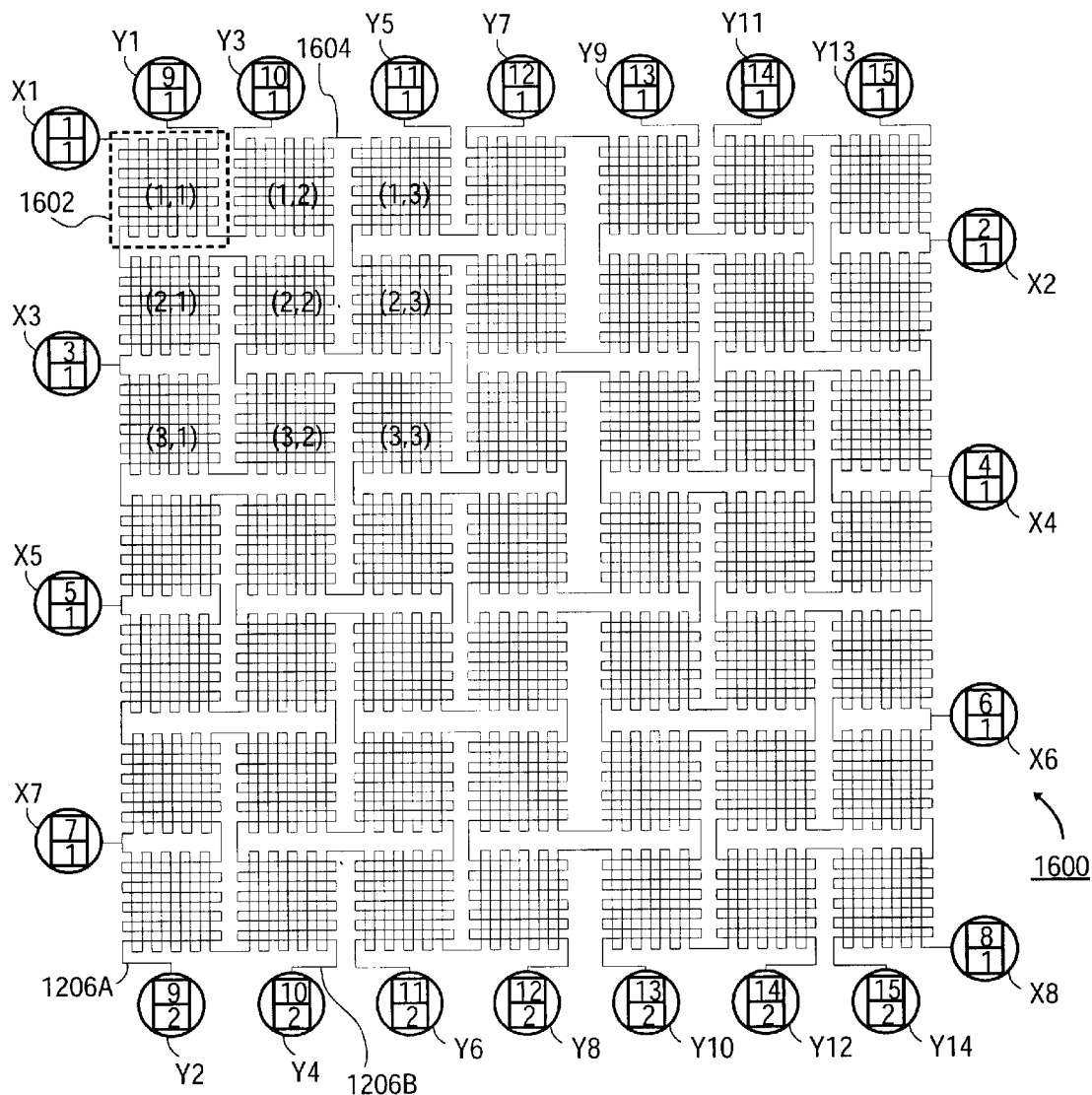
FIG. 16 shows a test chip including forty-nine conduction units and twenty-two test pads for detecting open- and short-circuit defects in contact vias and stacked via chains.

FIG. 16 shows a test chip 1600 including forty-nine conduction units 1602 and twenty-two test pads for detecting open- and short-circuit defects in contact vias and stacked via chains. Each conduction unit 1602 is composed of an array of intermeshed conduction paths. Test chip 1600 includes two sets of test pads. The first set of test pads include the test pads on the left side of the array X1, X3, X5, X7, and test pads on the right side of the array X2, X4, X6, and X8. The first set of test pads are connected by conduction path 1604. The second set of test pads include the test pads on the upper side of the array Y1, Y3, Y5, ..., Y13, and test pads on the lower side of the array Y2, Y4, Y6, ..., Y14. Test pads Y1 and Y2 are connected by conduction path 1606a, which runs through the first column of conduction units. Test pads Y3 and Y4 are connected by conduction path 1606b, which runs through the second column of conduction units, etc.

By measuring the conductivity between the test pads Y1 and Y2, any open circuit defect located within the first column of conduction units can be detected. By measuring the conductivity between the test pads X1 and X2, any open circuit defect located within the first row of conduction units can be detected. If the connectivity between test pads X1 and X2 is broken, and the connectivity between test pads Y1 and Y2 is also broken, while the conduction paths in all other rows and columns are intact, then it may be inferred that there is a defect in the conduction unit (1,1). The location of defects in any of the other forty-eight conduction units can be determined in a likewise manner.

To determine whether there is a short-circuit defect, the test pads X1, X2 are first set to high voltage. The test pads Y1, Y2 are set to ground voltage. The other test pads are floated. If there is no current flowing between test pads X1, X2 to Y1, Y2 then there is no short-circuit defect. If there is a current, then the magnitude of the current is measured, and denoted as I(1,1). Next, test pads X1, X2 are still set high, while test pads Y2, Y3 are set to ground, and the others floated. The current flowing from test pads X1, X2 to Y2, Y3 is measured as I(1,2). This process is repeated, with I(1,7) measured by setting test pads X1, X2 to high, test pads Y6, Y7 to ground, and others floating. Next, test pads X2, X3 are set to high, test pads Y1, Y2 are set to ground, and others floating. The current flowing from test pads X2, X3 to Y1, Y2 is measured as I(2,1). The process is repeated until I(i, j) (i=1 ... 7, j=1 ... 7) are all measured. The location of a short-circuit defect is determined by finding the "local maximum" of currents. As an example, if there is a short-circuit defect in conduction unit (2,2), then current I(2,2) will be larger than current I(1,1), I(1,2), I(1,3), I(2,1), I(2,3), I(3,1), I(3,2), and I(3,3). Current I(2, 2) will be flowing from test pads X2, X3 to Y2, Y3 via the short-circuit defect in conduction unit (2,2). The conduction path between X3 and Y2 is the shortest of all conduction paths between X test pads and Y test pads, has the least resistance, and thus has the largest leakage current.

The details of the conduction unit 1602 are similar to the one shown in FIG. 4(c). Each conduction path is composed of upper conduction segments and lower conduction segments. The upper and lower conduction segments are connected by contact vias. If the contact vias have any defect, the conductivity of the conduction path would be broken. Thus, this testing circuit is suitable for finding defects in the contact via processing steps. The details of the contact via and stacked via chain structures are similar to those shown in FIGS. 5(a), 5(b), 6(a), 6(b), and 6(c).

Figure 17A:
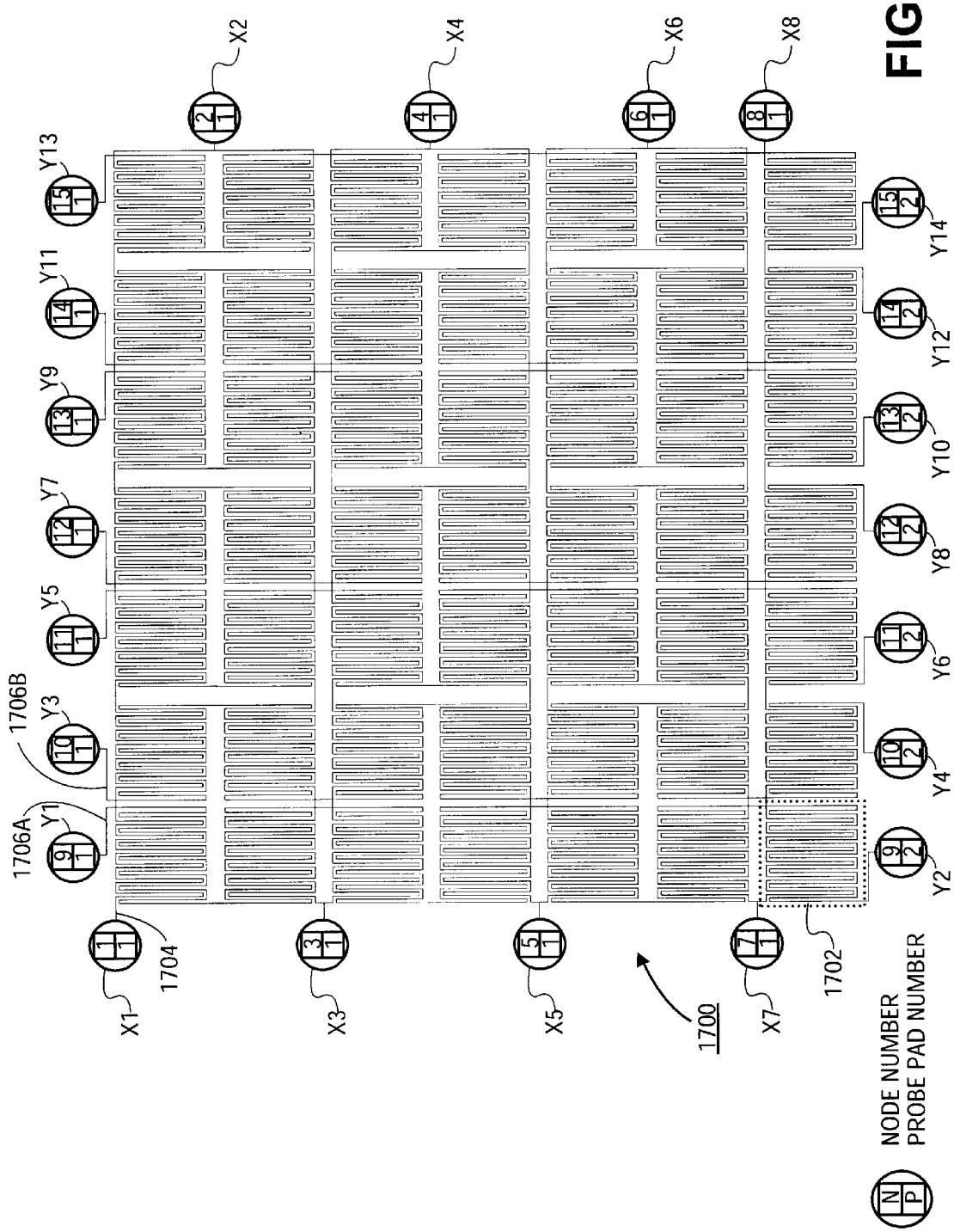
FIG. 17(a) shows a test chip for detecting open-circuit and short-circuit defects of dense conduction layers.

FIG. 17(a) shows a test chip 1700 for detecting open-circuit and short-circuit defects of dense conduction layers. Test chip 1700 includes sixty-four conduction units 1702 and twenty-two test pads. Each conduction unit 1702 is composed of closely-spaced meander-style conduction lines, the details are similar to the ones shown in FIG. 7(c). Test chip 1700 includes two sets of test pads. The first set of test pads include the left test pads X1, X3, X5, X7 and the right test pads X2, X4, X6, and X8. The second set of test pads include the upper test pads Y1, Y3, Y5, Y7, and the lower test pads Y2, Y4, Y6, and Y8. The first set of test pads are electrically connected by conduction path 1704. Test pads Y1 and Y2 are connected by conduction paths 1706a, and test pads X3 and X4 are connected by conduction paths 1706b, etc.

By measuring the conductivity between the test pads Y1 and Y2, an open-circuit defect located within the first column of conduction units can be detected. By measuring the conductivity between the test pads X1 and X2, an open-circuit defect located within the first row of conduction units can be detected. If the connectivity between test pads Y1 and Y2 is broken, and the connectivity between test pads X1 and X2 is also broken, while conduction paths through other columns and rows are intact, then it can be inferred that there is a defect in the conduction unit (1,1). The location of defects in any of the other forty-eight conduction units can be determined in a likewise manner.

To determine whether there is a short-circuit defect, the test pads X1, X2 are first set to high voltage. The test pads Y1, Y2 are set to ground voltage. The other test pads are floated. If there is no current flowing between test pads X1, X2 to Y1, Y2, then there is no short-circuit defect. If there is a current, then the magnitude of the current is measured) and denoted as I(1,1), Next, test pads X1, X2 are still set high, while test pads Y2, Y3 are set to ground, and the others floated The current flowing from test pads X1, X2 to Y2, Y3 is measured as I(1,2). This process is repeated, with I(1,7) measured by setting test pads X1, X2 to high, test pads Y6, Y7 to ground, and others floating. Next, test pads X2, X3 are set to high, test pads Y1, Y2 are set to ground, and others floating. The current flowing from test pads X2, X3 to Y1, Y2 is measured as I(2,1). The process is repeated until I(i, j) (i=1 . . . 7, j=1 . . . 7) are all measured. The location of a short-circuit defect is determined by the "local maximum" of currents. As an example, if there is a short-circuit defect in conduction unit (2,2), then current I(2,2) will be larger than current I(1,1), I(1, 2), I(1,3), I(2,1), I(2,3), I(3,1), I(3,2), and I(3,3). Current I(2, 2) will be flowing from test pads X2, X3 to Y2, Y3 via the shortcircuit defect in conduction unit (2,2). The conduction path between X3 and Y2 is the shortest of all conduction paths between X test pads and Y test pads, has the least resistance, and thus has the largest leakage current.

Figure 17B:
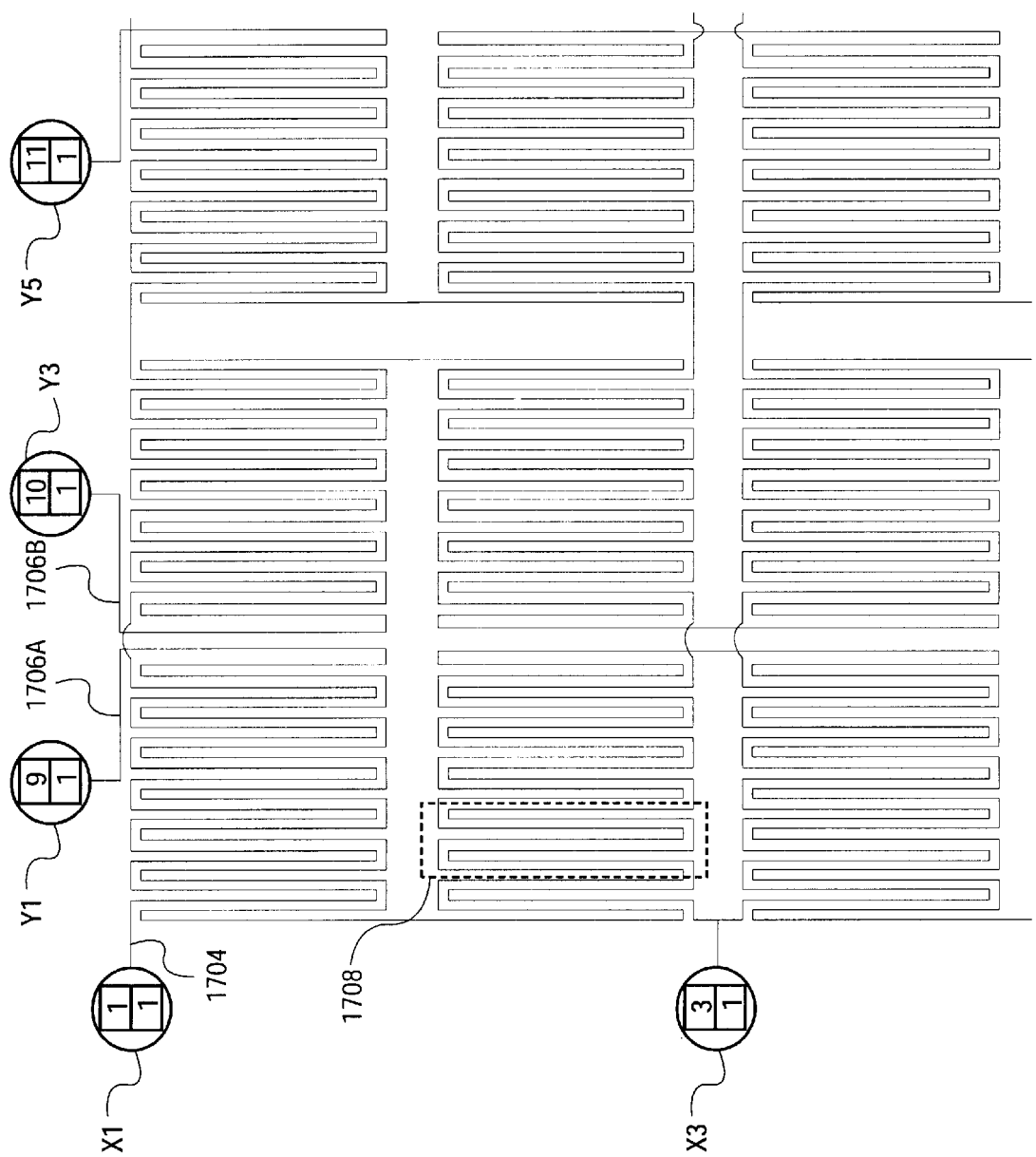
FIG. 17(b) shows an enlarged diagram of nine conduction units of a test chip.

FIG. 17(b) shows an enlarged diagram of nine conduction units of the test chip 1700. An enlargement of a portion 1708 of the conduction unit 1702 is similar to the one shown in FIG. 7(c).

Figure 18A:
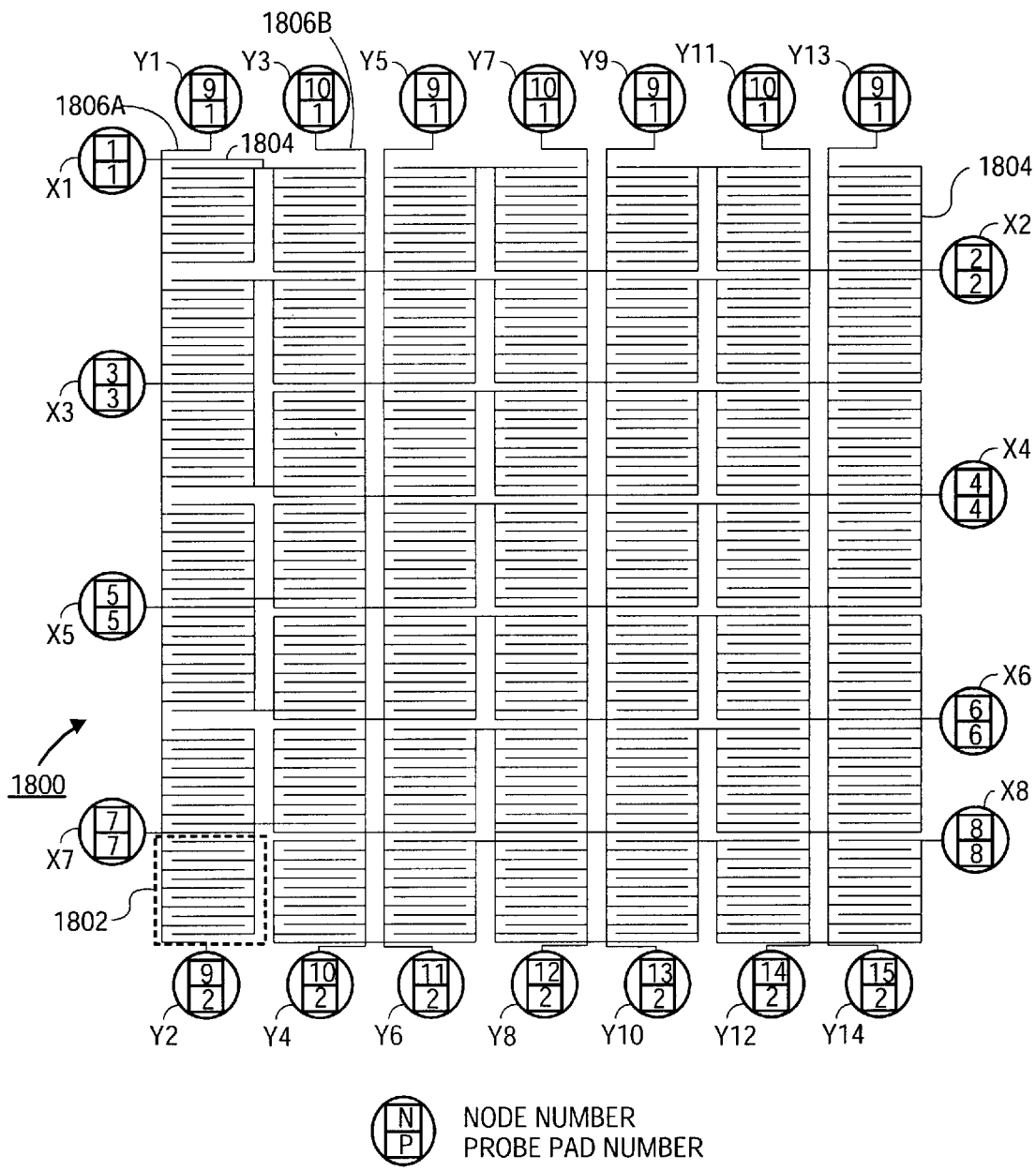
FIG. 18(a) shows a test chip for monitoring defects with the conduction lines having the maximum line width and minimum spacing between lines allowed by the design rules.
Figure 18B:
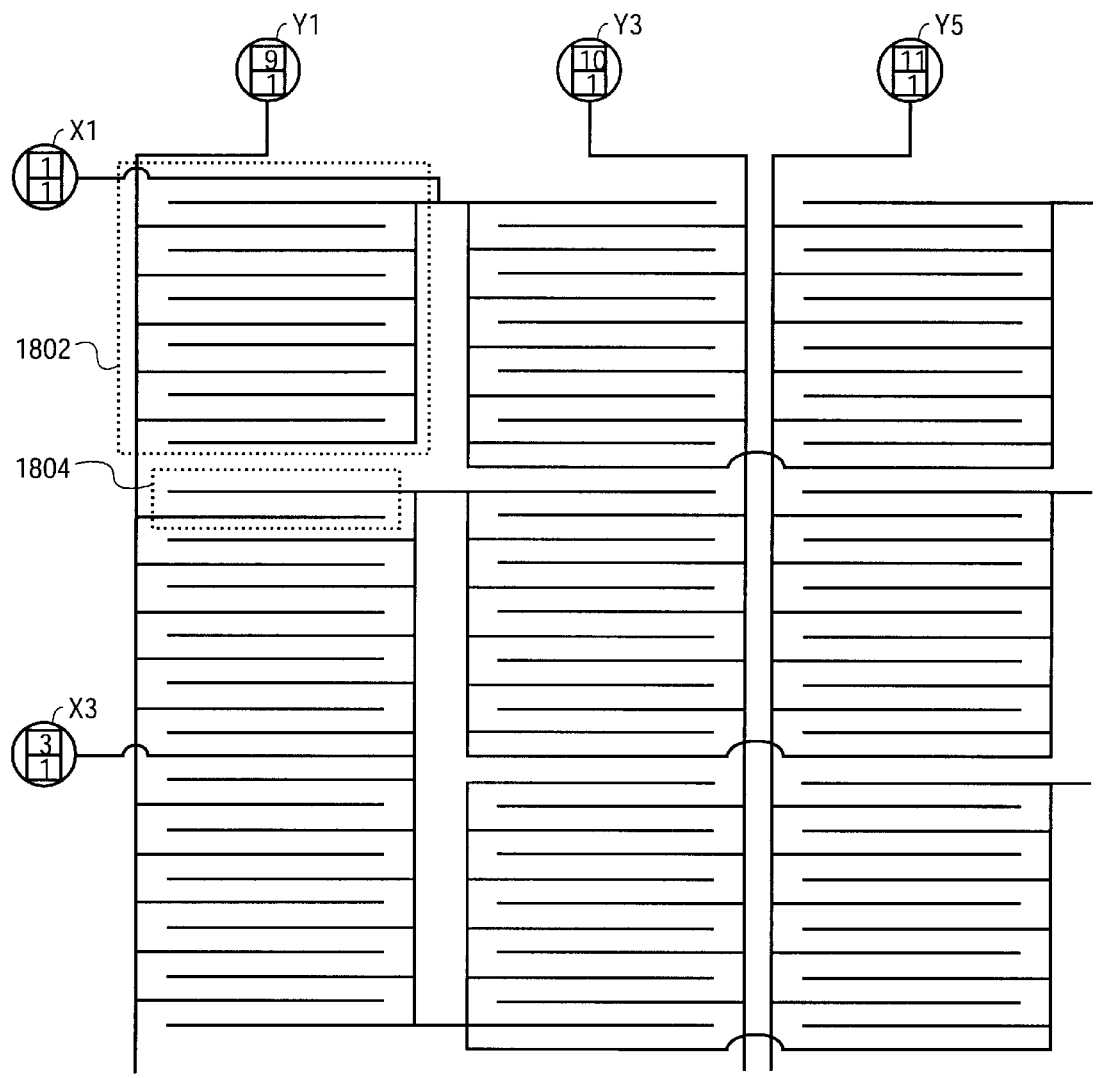
FIG. 18(b) shows an enlarged diagram of nine conduction units of a test chip.

FIG. 18(a) shows a test chip 1800 for monitoring defects with the conduction lines having the maximum line width and minimum spacing between lines allowed by the design rules. Test chip 1800 can also be used to monitor the leakage current between well regions, between P-plus doping regions, between N-plus doping regions, and between P-plus and N-plus junctions. Test chip 1800 includes forth-nine conduction units 1802 and twenty-two test pads. Each conduction unit 1802 is composed of an array of closely-spaced comb-style conduction paths, the details of which are shown in FIG. 18(b). An enlargement of a portion 1804 is shown in FIG. 8(c). Test chip 1800 includes two sets of test pads. The first set of test pads include the left side test pads X1, X3, X5, X7, and the right side test pads X2, X4, X6, and X8. The first set of test pads are connected by conduction path 1804. The second set of test pads includes the upper side test pads Y1, Y3, Y5, Y7, Y9, Y11, Y13, and the lower test pads Y2, Y4, Y6, Y8, Y10, Y12, and Y14. Each Y test pad is connected to a column of conduction units.

To determine whether there is a short-circuit defect, the test pads X1, X2 are first set to high voltage. The test pads Y1, Y2 are set to ground voltage. The other test pads are flow If there is no current flowing between test pads X1, X2 to Y1, Y2, then there is no short-circuit defect. If there is a current, then the magnitude of the current is measured, and denoted as I(1,1). Next, test pads X1, X2 are still set high, while test pads Y2, Y3 are set to ground, anid the others floated. The current flowing from test pads X1, X2 to Y2, Y3 is measured as I(1,2). This process is repeated, with I(1,7) measured by setting test pads X1, X2 to high, test pads Y6, Y7 to ground, and others floating. Next, test pads X2, X3 are set to high, test pads Y1, Y2 are set to ground, and others floating. The current flowing from test pads X2, X3 to Y1, Y2 is measured as I(2,1). The process is repeated until I(i, j) (i=1 . . . 7, j=1 . . . 7) are all measured. The location of a short-circuit defect is determined by finding the "local maximum" of currents. As an example, if there is a short-circuit defect in conduction unit (2,2), then current I(2,2) will be larger than current I(1,1), I(l, 2), I(1,3), I(2,1), I(2,3), I(3,1), I(3,2), and I(3,3). Current I(2, 2) will be flowing from test pads X2, X3 to Y2, Y3 via the short-circuit defect in conduction unit (2,2). The conduction path between X3 and Y2 is the shortest of all conduction paths between X test pads and Y test pads, has the least resistance, and thus has the largest leakage current.

FIG. 18(b) shows an enlarged diagram of nine conduction units of the test chip 1800. An enlargement of a portion 1804 of the conduction unit 1802 is similar to the one shown in FIG. 7(c).

The flowchart for the method of determining the short-circuit defects using test chips 1600, 1700, 1800 is similar to the one shown in FIG. 9.

While the preferred embodiment of the invention has been illustrated and described, it will be appreciated that various changes can be made therein without departing from the spirit and scope of the invention.

What is claimed is:

1. A test structure for detecting defects in a semiconductor wafer, comprising:

An array of conduction units, said array having an upper side, a lower side, a left side, and a right side;

a first set of test pads connected to conduction units situated along said left side of said array;

a second set of test pads connected to conduction units situated along said right side of said array;

a third set of test pads connected to conduction units situated along said upper side of said array;

a fourth set of test pads connected to conduction units situated along said lower side of said array;

a first set of conduction paths, each one of said first set of conduction paths running through a row of conduction units and connects one of said first set of test pads to one of said second set of test pads;

a second set of conduction paths, each one of said second set of conduction paths running through a column of conduction units and connects one of said third set of test pads to one of said fourth set of test pads;

wherein applying a predetermined set of test signals to said first, second, third, and fourth set of test pads, the location of a defect is determined from the response signals measured from said first, second, third, and fourth set of test pads.

2. The test structure of claim 1, wherein said array of conduction units are clabeled as U(i, j);

wherein said predetermined set of test signals includes a high voltage signal applied to one of said first set of test pads X(i) and one of said second set of test pads X(i+1), a low voltage signal applied to one of said third set of test pads Y(j) and one of said fourth set of test pads Y(j+1), and leaving the other test pads floating;

wherein the current I(i, j) flowing from test pads X(i), X(i+1) to test pads Y(j), Y(j+1) are measured and a short-circuit defect is detected at conduction unit U(i, j) if I(ij) is a local current maximum.

3. The test structure of claim 1, wherein said conduction unit comprises intermeshed meander-style conduction paths.

4. The test structure of claim 3, wherein said conduction path comprises an upper path and a lower path, said upper path comprises of alternating segments of conductive segments and non-conductive segments, said lower path comprises of alternating segments of conductive segments and non-conductive segments, and said conductive segments of said upper path is connected to said conductive segments of said lower path by contact vias.

5. The test structure of claim 1, wherein said conduction unit comprises closely spaced meander-style conduction lines.

6. The test structure of claim 1, wherein said conduction unit comprises closely spaced comb-style conduction lines.

* * * * *